United States Patent
Yamamoto et al.

(10) Patent No.: US 6,420,945 B1
(45) Date of Patent: Jul. 16, 2002

(54) PIEZOELECTRIC RESONATOR HAVING INTERNAL ELECTRODE FILMS, PIEZOELECTRIC COMPONENT AND LADDER FILTER FORMED THEREFROM

(75) Inventors: Takashi Yamamoto, Hakui; Hirofumi Funaki, Toyama-ken, both of (JP)

(73) Assignee: Murata Manufacturing Co. Ltd, Kyoto (JP)

( * ) Notice: Subject to any disclaimer, the term of this patent is extended or adjusted under 35 U.S.C. 154(b) by 0 days.

(21) Appl. No.: 09/537,590

(22) Filed: Mar. 28, 2000

(30) Foreign Application Priority Data

| Apr. 9, 1999 | (JP) | 11-102954 |
| Apr. 23, 1999 | (JP) | 11-117225 |
| Apr. 28, 1999 | (JP) | 11-121793 |

(51) Int. Cl.⁷ .............................. H03H 9/15; H03H 9/58
(52) U.S. Cl. .................... 333/189; 333/187; 310/366
(58) Field of Search ................ 333/186, 187, 333/189, 190, 192; 310/321, 322, 348, 357, 366, 368, 320

(56) References Cited

U.S. PATENT DOCUMENTS

| 4,894,580 A | * | 1/1990 | Ogawa | 310/320 |
| 4,900,970 A | * | 2/1990 | Ando et al. | 310/320 |
| 5,260,675 A | * | 11/1993 | Ogawa et al. | 333/189 |
| 5,400,001 A | * | 3/1995 | Asakawa et al. | 333/189 X |
| 5,598,133 A | * | 1/1997 | Fuse | 333/189 |
| 5,825,262 A | * | 10/1998 | Inoue et al. | 333/189 |
| 6,198,200 B1 | * | 3/2001 | Kaida et al. | 310/320 |
| 6,201,337 B1 | * | 3/2001 | Kaida et al. | 310/321 |
| 6,229,246 B1 | * | 5/2001 | Kaida | 310/320 |

FOREIGN PATENT DOCUMENTS

| EP | 0 802 629 A2 | * | 10/1997 |
| EP | 0 884 842 A2 | * | 12/1998 |

* cited by examiner

*Primary Examiner*—Robert Pascal
*Assistant Examiner*—Barbara Summons
(74) *Attorney, Agent, or Firm*—Keating & Bennett, LLP

(57) ABSTRACT

A piezoelectric resonator includes a plurality of piezoelectric plates and a plurality of electrode films which are alternately disposed so as to be integrated and to define a monolithic piezoelectric body. External electrodes are located at nodal points at substantially central portions of two side surfaces of the monolithic piezoelectric body. A first pair of electrode films are electrically connected together by a first external electrode and a second pair of electrode films are electrically connected together by a second external electrode. The piezoelectric resonator is arranged such that capacitance across the terminals thereof is increased without using different piezoelectric materials for the piezoelectric plates and without reducing the strength of the resonator.

17 Claims, 16 Drawing Sheets

PIEZOELECTRIC RESONATOR HAVING INTERNAL ELECTRODE FILMS, PIEZOELECTRIC COMPONENT AND LADDER FILTER FORMED THEREFROM

BACKGROUND OF THE INVENTION

1. Field of the Invention

The present invention relates to piezoelectric resonators utilizing extensional vibration. The present invention also relates to piezoelectric components and ladder filters for surface-mounting. Further, the present invention relates to ladder filters having piezoelectric resonators utilizing extensional vibration.

2. Description of the Related Art

The structure of a conventional piezoelectric resonator 1 utilizing extensional vibration is shown in FIG. 1. In the piezoelectric resonator 1, a piezoelectric plate 2 is polished to have a thickness T and electrode films 3a and 3b are provided on the principal planes of the piezoelectric plate 2 such that the piezoelectric plate 2 is polarized in the thickness direction by polarization processing. When T is the thickness of the piezoelectric resonator 1, and L1 and L2 are lengths of edges thereof, the capacitance across terminals (capacitance between electrodes) Cf is defined by the following equation (1), $$Cf = (\epsilon_o \cdot \epsilon_s \cdot L1 \cdot L2)/T \tag{1},$$

wherein: $\epsilon_o$=dielectric constant under vacuum; and $\epsilon_s$=specific dielectric constant of the piezoelectric plate.

The resonance frequency fr of the extensional vibration of the piezoelectric resonator 1 is defined by the following equation (2) under the condition L1≅L2, $$fr = V/L1 \tag{2},$$

wherein V=wave motion speed propagating in the piezoelectric plate 2, and V≅2000 m/sec. Therefore, when the required resonance frequency fr is determined, lengths of edges L1=L2 of the piezoelectric resonator 1 are determined according to the equation (2).

Accordingly, in order to increase the capacitance across terminals Cf of the piezoelectric resonator 1 at a predetermined resonance frequency fr, a piezoelectric material having a large specific dielectric constant $\epsilon_s$ needs to be selected or the thickness T of the piezoelectric plate 2 needs to be reduced according to the above equation (1).

However, when the specific dielectric constant $\epsilon_s$ of the piezoelectric material used for the piezoelectric plate 2 is increased, other piezoelectric constants such as a piezoelectric quality constant Qm and an electromechanical constant k are also changed, so that only the capacitance across terminals Cf cannot be increased without changing other piezoelectric constants. On the other hand, when the thickness T of the piezoelectric plate 2 is excessively reduced, the piezoelectric resonator 1 is liable to crack when subjected to external impacts caused for example by dropping. Thus, this method of reducing the thickness of the piezoelectric plate 2 has limitations. When L1≅L2≅4.5 mm (fr=450 kHz), the thickness T at the limit of the strength required is empirically and approximately 300 μm.

Piezoelectric components used for surface-mount ladder filters are disclosed in Japanese Unexamined Patent Publication No. 8-18382 and Japanese Unexamined Patent Publication No. 7-176977. In these piezoelectric components, a plurality of piezoelectric resonators and metallic terminals which are aligned in a line alternating in the vertical direction are accommodated in a case and external electrodes are provided by bending lead portions of the metallic terminals so as to extend outside of the case.

However, these piezoelectric components have a large external thickness, so that the piezoelectric component protrudes greatly from a surface of a substrate when being mounted on the substrate, thereby causing difficulties for use as a circuit substrate in a low-profile device and preventing a device from being modified into a low profile device.

In these piezoelectric components, the required number of metallic terminals is increased. For example, when a component includes four piezoelectric resonators, four to five metallic terminals are required. Thereby, the cost of materials is increased and the assembly time is increased, resulting in added costs necessary to produce the piezoelectric component.

The circuit diagram of a conventional four-element type (two-stage) ladder filter 201 is shown in FIG. 14. The ladder filter 201 has two series-connected resonators 204S and 205S connected together in series between an input-terminal 202 and an output-terminal 203 and two parallel-connected resonators 206P and 207P respectively inserted between each of the output-sides of the respective resonators 204S and 205S and the ground. When the ladder filter is assembled to produce an actual component, the combination of two series-connected resonators and two parallel-connected resonators are vertically sandwiched together via a terminal board, and is accommodated into a case. (For example, Japanese Unexamined Utility Model Publication No. 4-76724).

The guaranteed attenuation $ATT_o$ of such a ladder filter is defined by the following equation (3), when the capacitance across terminals of the series-connected resonators 204S and 205S is $Cf_{so}$ and the capacitance across terminals of the parallel-connected resonators 206P and 207P is $Cf_{po}$, $$ATT_o 2 \times 20 Log(Cf_{so}/Cf_{po}) \tag{3}.$$

Referring to FIG. 15, in the conventional series-connected resonators 204S and 205S and the parallel-connected resonators 206P and 207P utilizing extensional vibration, on both surfaces of a piezoelectric plate 208 having a square shape electrodes 209 are provided. When $L_s$ is the edge length of the series-connected resonators 204S and 205S, $T_s$ is the thickness thereof, $\epsilon_s$ is the specific dielectric constant thereof, and $\epsilon_o$ is the dielectric constant under vacuum, the capacitance $Cf_{so}$ across terminals of the series-connected resonators 204S and 205S is defined by the following equation (4), $$Cf_o = (\epsilon_o \cdot \epsilon_s \cdot L_s^2)/T_s \tag{4}.$$

Likewise, when Lp is the edge length of the parallel-connected resonators 206p and 207p, $T_p$ is the thickness thereof, $\epsilon_p$ is the specific dielectric constant thereof, and $\epsilon_c$ is the dielectric constant under vacuum, the capacitance $Cf_{po}$ across terminals of the parallel-connected resonators 206p and 207p is defined by the following equation (5), $$Cf_{po} = (\epsilon_o \cdot \epsilon_p \cdot L_p^2)/T_p \tag{5}.$$

Therefore, substituting the values of the equations (4) and (5) into the above equation (3) yields the following equation (6) for obtaining the guaranteed attenuation $ATT_o$, $$ATT_o = 2 \times 20 Log\, [(\epsilon_s \cdot L_s^2 \cdot T_p)/(\epsilon_p \cdot L_p^2 \cdot T_s)] \tag{6}.$$

Furthermore, the resonance frequency of the series-connected resonators 204S and 205S and the resonance frequency of the parallel-connected resonators 206p and 207p are both determined by their respective sizes (edge lengths $L_s$ and $L_p$). When a ladder filter having the required frequency is manufactured, the sizes of the series-connected resonators 204S and 205S and the parallel-connected resonators 206p and 207p are the same ($L_s=L_p$), so that the guaranteed attenuation $ATT_o(<0)$ is defined by the following equation (7), $$ATT_o = 2 \times 20 \mathrm{Log}\,[(\epsilon_s \cdot T_p)/(\epsilon_p \cdot T_s)] \qquad (7).$$

Therefore, in order to increase the guaranteed attenuation $ATT_o$ (the absolute value), it is necessary that the specific dielectric constant $\epsilon_s$ of the series-connected resonators 204S and 205S is reduced while the specific dielectric constant $\epsilon_p$ of the parallel-connected resonators 206p and 207p is increased. It is also necessary that the thickness $T_s$ of the series-connected resonators 204S and 205S is increased while the thickness $T_p$ of the parallel-connected resonators 206p and 207p is decreased.

However, when considering other piezoelectric characteristics such as a piezoelectric quality constant Qm, an electromechanical constant k, and temperature characteristics, it is preferable that the same piezoelectric material be used for the series-connected resonators 204S and 205S and the parallel-connected resonators 206p and 207p. It is difficult to select piezoelectric materials for the series-connected resonators 204S and 205S and the parallel-connected resonators 206p and 207p individually relative to only the specific dielectric constants $\epsilon_s$ and $\epsilon_p$.

Also, with decreasing the thickness $T_p$ of the parallel-connected resonators 206p and 207p, the strength thereof is reduced so that the element itself is susceptible to break (cracking or other damage), while with increasing the thickness $T_s$ of the series-connected resonators 204S and 205S, the ladder filter itself will be heavier and much larger. Due to the above-mentioned limitations in manufacturing, the conventional ladder filter has another drawback in that the guaranteed attenuation $ATT_o$ cannot be freely designed.

SUMMARY OF THE INVENTION

To overcome the problems discussed above, preferred embodiments of the present invention provide a piezoelectric resonator which is arranged such that capacitance across terminals have a large value without decreasing the strength thereof and without having different piezoelectric materials being used for the piezoelectric plates.

Further, preferred embodiments of the present invention also provide a piezoelectric component including a plurality of piezoelectric elements or a ladder filter having a plurality of series-connected resonators and parallel-connected resonators that have a low-profile and which are suitable for surface mounting.

Further, preferred embodiments of the present invention provide a ladder filter having a large amount of guaranteed attenuation while having series-connected resonators and parallel-connected resonators that have approximately the same thickness and are made of the same piezoelectric material.

In a preferred embodiment of the present invention, a piezoelectric resonator vibrating in an extensional vibration mode includes a plurality of piezoelectric plates, and a plurality of electrode films. The piezoelectric plates and the piezoelectric films are alternately disposed so as to be integrated and so as to define a monolithic piezoelectric body. Also, a first set of the plurality of electrode films are electrically connected to each other while a second set of plurality of electrode films are electrically connected to each other.

With these features of the piezoelectric resonator, a piezoelectric element vibrating in an extensional mode includes a piezoelectric plate and electrode films provided on both major surfaces of the piezoelectric plate and the piezoelectric resonator has a plurality of these resonator elements, thereby enabling the capacitance across terminals to be increased without changing the size of the piezoelectric plates and while using the same piezoelectric materials for the resonator elements.

In addition, since the piezoelectric resonator has a structure in which plurality piezoelectric plates are arranged to define an integral, unitary member, even when the capacitance across terminals is increased by reducing the thickness of the piezoelectric plates, cracking of the piezoelectric plates is prevented. Therefore, the capacitance across terminals of the piezoelectric resonator is significantly increased without decreasing the strength of the piezoelectric resonator although the thickness of each piezoelectric plate is reduced.

Preferably, a piezoelectric resonator also includes a plurality of side surface electrodes preferably disposed at nodal points on external end surfaces of the monolithic body of the plurality of piezoelectric plates and the plurality of electrode films, wherein some of the plurality of electrode films are electrically connected to each other by some of the plurality of side surface electrodes while the rest of the plurality of electrode films may be electrically connected to each other by some of the other plurality of side surface electrodes.

With these features of the piezoelectric resonator, since a side surface electrode is provided substantially at a nodal point on the external surface of the monolithic body, the extensional vibration of the piezoelectric resonator is not affected or damped by the arrangement of the side surface electrode.

In another preferred embodiment of the present invention, a piezoelectric device includes a plurality of piezoelectric plates, and a case, wherein the plurality of piezoelectric plates are arranged in one plane of the case.

With these features of the piezoelectric device (including a ladder filter), a plurality of plate-shaped piezoelectric elements are arranged in one plane in the case, thereby achieving a low-profile piezoelectric device. Therefore, when being mounted on a circuit board or other similar electronic devices, the mounting height is not increased, thereby contributing to low-profile apparatuses. The structure of the metallic terminal can also be simplified by arranging the piezoelectric elements in one plane, so that the number of required metallic terminals is also greatly reduced.

In the piezoelectric device, the plurality of piezoelectric plates preferably have substantially the same thickness.

With these features of the piezoelectric device, because of the piezoelectric elements having substantially the same thickness, no space is wasted in the case, thereby contributing to a low-profile piezoelectric device. Since the thickness of each piezoelectric element is substantially the same, assembly of the device is also improved when assembling with terminals.

In another preferred embodiment of the present invention, a ladder filter includes series-connected plate-shaped resonators, parallel-connected plate-shaped resonators having internal electrodes disposed in the thickness direction thereof, and a case. The series-connected plate-shaped resonators and the parallel-connected plate-shaped resonators are arranged in one plane of the case.

With these features of the ladder filter, since the series-connected plate-shaped resonators and the parallel-connected plate-shaped resonators are arranged in one plane in the case, a low-profile ladder filter is achieved. Therefore, when being mounted on a circuit board or other electronic devices, the mounting height is not increased thereby contributing to low-profile apparatuses. The structure of the metallic terminals are simplified by arranging the ladder filters in one plane, so that the number of required metallic terminals is reduced.

Furthermore, since the parallel-connected resonators have a deposited structure of electrodes in the thickness direction, the capacitance across terminals of the parallel-connected resonators is significantly increased while using the same piezoelectric materials and while reducing the thickness of the parallel-connected resonators, which results in increasing the guaranteed attenuation of the ladder filter.

In another preferred embodiment of the present invention, a ladder filter includes series-connected resonators, parallel-connected resonators including a plurality of piezoelectric plates and plurality of electrodes. The parallel-connected resonators have the electrodes disposed in a thickness direction thereof and such that the piezoelectric plates are interposed between the electrodes. A case is also provided, wherein the series-connected resonators are stacked on each other on one side of the case and the parallel-connected resonators are stacked on each other at another side of the case.

With these features of the ladder filter, since the parallel-connected resonators have a structure in which electrodes are deposited in the thickness direction by having piezoelectric plates interposed between the electrodes, the distance between the electrodes is reduced without reducing the thickness of the parallel-connected resonators, resulting in increased capacitance across terminals of the parallel-connected resonators. Accordingly, the guaranteed attenuation of the ladder filter is also increased. In particular, when forming the series-connected resonators and the parallel-connected resonators with the same material, the capacitance across terminals of the parallel-connected resonators is increased larger than that of the series-connected resonators and the guaranteed attenuation of the ladder filter is preferably increased.

Preferably, the ladder filter further includes an external electrode disposed substantially at a nodal point of vibration of the parallel-connected resonators, wherein the electrodes are connected together by the external electrode.

With these features of the ladder filter, the electrodes are connected together by the external electrode substantially located at a nodal point of vibration of the parallel-connected resonators, so that the capacitance across terminals of the parallel-connected resonators is increased by parallel-connecting each electrostatic capacitance across the electrodes. Moreover, since the external electrode is provided substantially at a nodal point of vibration, piezoelectric vibration of the parallel-connected resonators is not restrained.

In the ladder filter, the thickness of the series-connected resonators is preferably substantially the same as the thickness of the parallel-connected resonators.

With these features of the ladder filter, when the thickness of the series-connected resonators and the parallel-connected resonators are substantially the same, the capacitance across terminals of the parallel-connected resonators is increased larger than that of the series-connected resonators, so that the guaranteed attenuation of the ladder filter is increased. When the thickness of the series-connected resonators and the parallel-connected resonators is substantially the same, it is not necessary as in the conventional ladder filter that the thickness of the parallel-connected resonators be reduced to increase the guaranteed attenuation, thus preventing cracking of the resonator. On the other hand, if the thickness of the series-connected resonators is increased, this results in a heavy or large ladder filter. Further, by providing a resonator with series-connected resonators and parallel-connected resonators having substantially the same thickness, simplification of the assembly process is also achieved.

Other features, elements, and advantages of the present invention will be described in detail below with reference to preferred embodiments of the present invention and the attached drawings.

BRIEF DESCRIPTION OF THE ATTACHED DRAWINGS

The present invention will become more fully understood from the detailed description provided below and the accompanying drawings which are given by way of illustration only, and thus do not limit the present invention and wherein.

Figure 16:
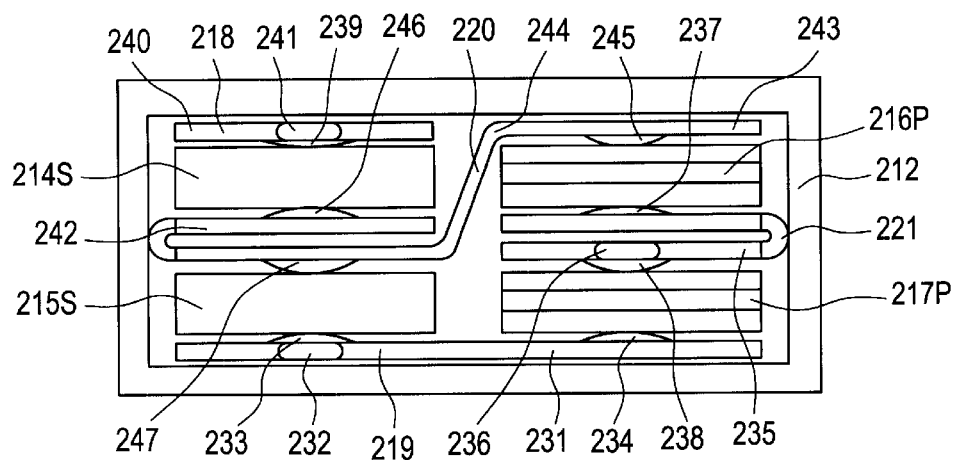
FIG. 16 is a front view showing the internal structure of a ladder filter according to another preferred embodiment of the present invention.
Figure 18:
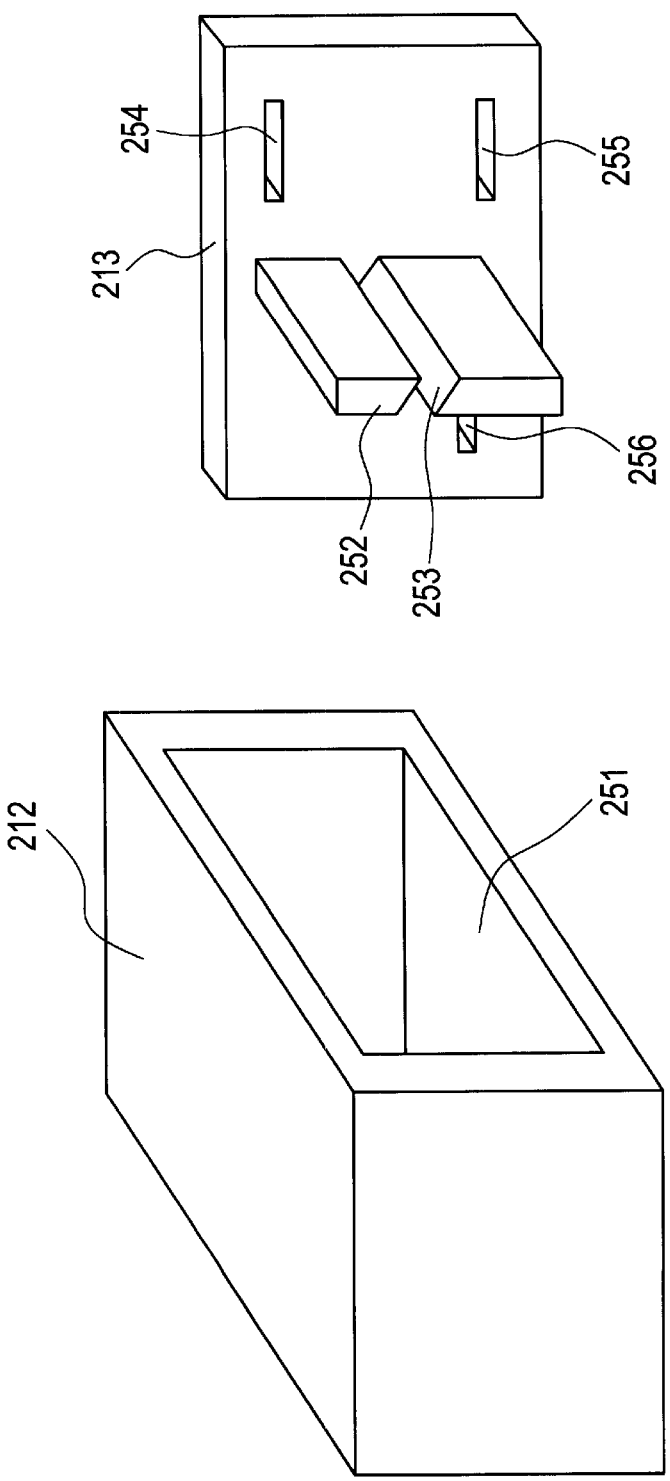
Figure 19:
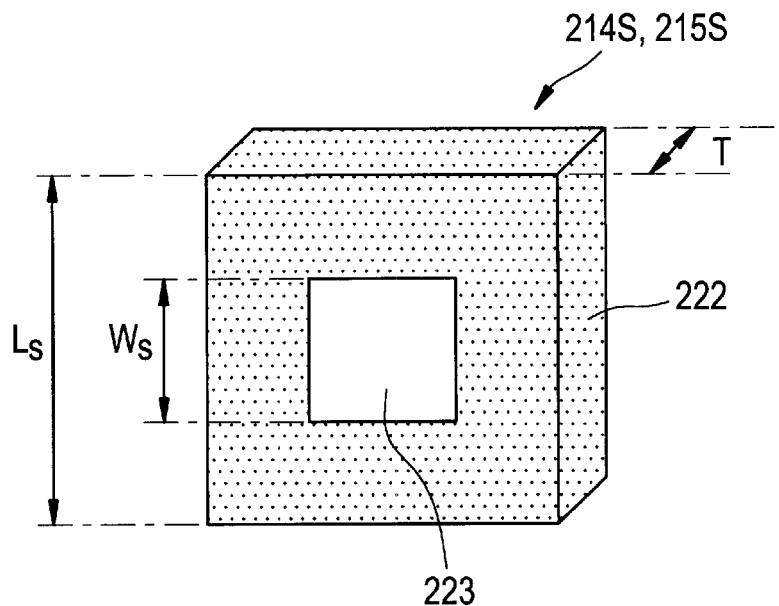
Figure 20:
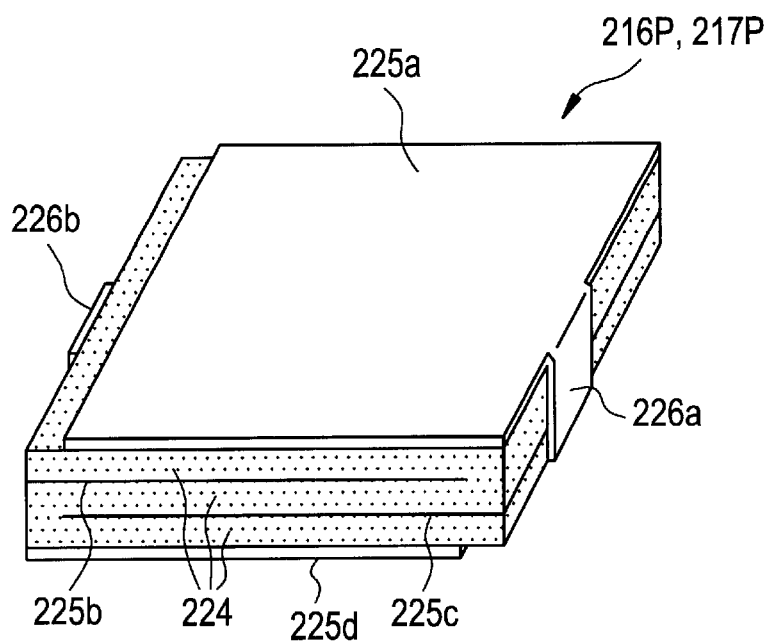
Figure 21A:
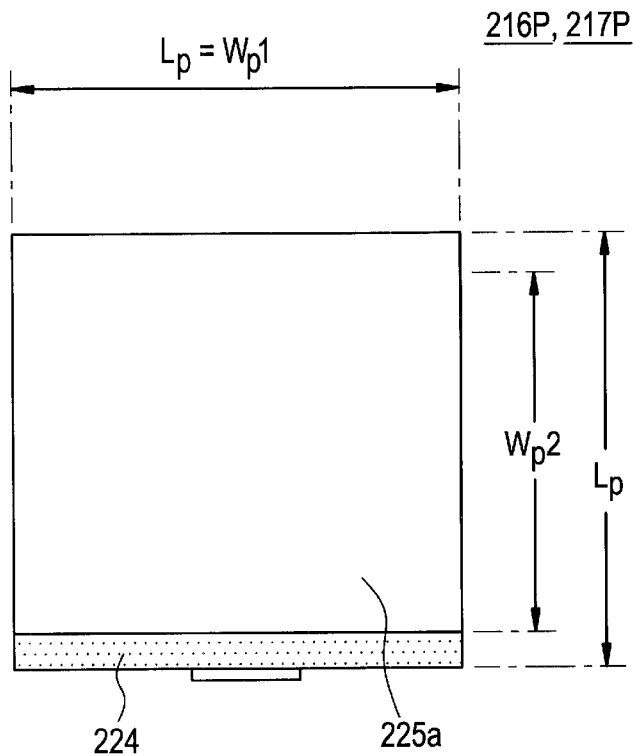
Figure 21B:
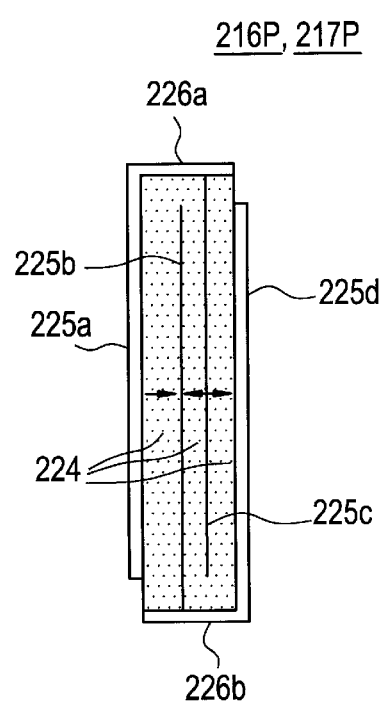
Figure 21C:
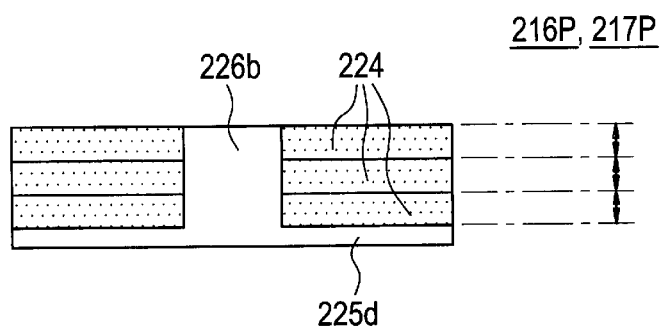

FIG. 18 includes views of the case and lid in the ladder filter shown in FIG. 16;

FIG. 19 is a perspective view of series-connected resonators used in the ladder filter shown in FIG. 16;

FIG. 20 is a perspective view of parallel-connected resonators used in the ladder filter shown in FIG. 16;

FIG. 21A is a plan view of the parallel-connected resonators shown in FIG. 20;

FIG. 21B is a side view of the parallel-connected resonators shown in FIG. 20; and FIG. 21C is a front view of the parallel-connected resonators shown in FIG. 20.

DETAILED DESCRIPTION OF PREFERRED EMBODIMENTS

Figure 2:
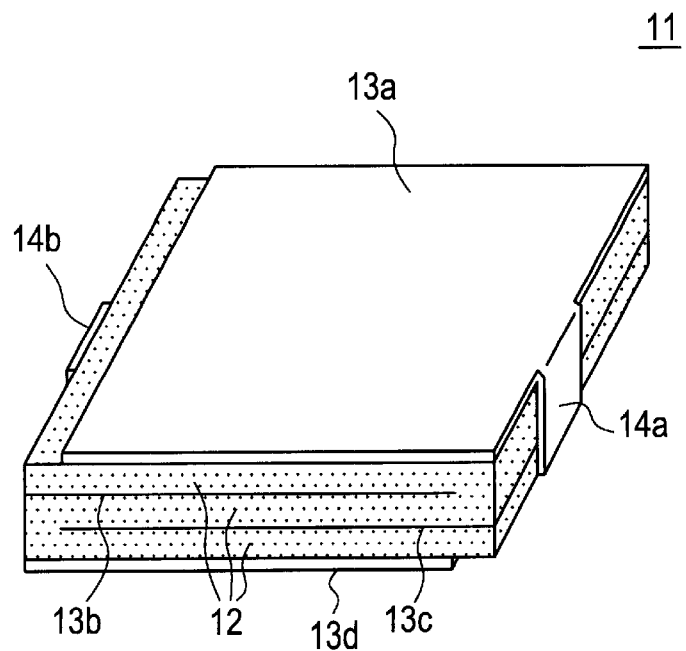
FIG. 2 is a perspective view of a piezoelectric resonator according to a preferred embodiment of the present invention.
Figure 3A:
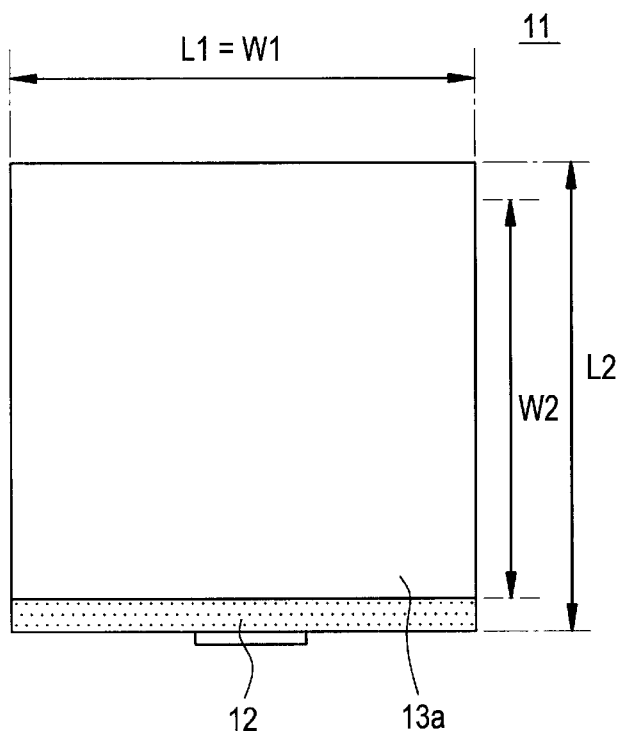
FIG. 3A is a plan view of the piezoelectric resonator of FIG. 2.
Figure 3B:
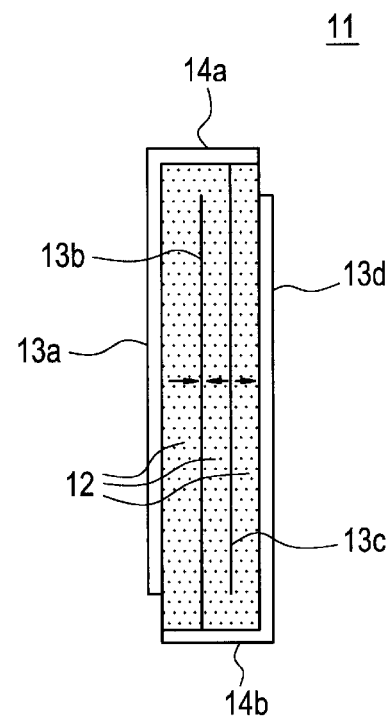
FIG. 3B is a side view of the piezoelectric resonator of FIG. 2.
Figure 3C:
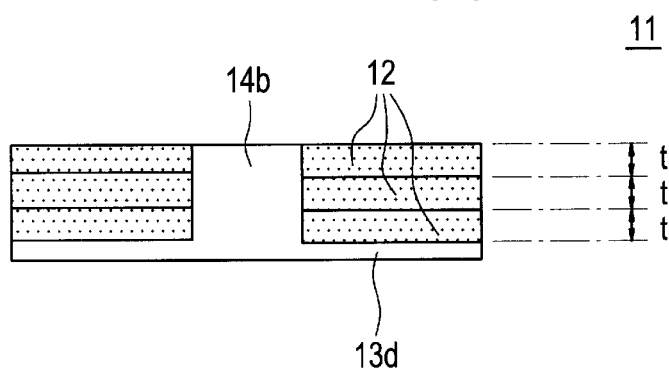
FIG. 3C is a front view of the piezoelectric resonator of FIG. 2.

FIG. 2 is a perspective view of a piezoelectric resonator 11 utilizing extensional vibration according to a preferred embodiment of the present invention. FIGS. 3A, 3B, and 3C are, respectively, a plan view, a side view, and a front view of the piezoelectric resonator 11 of FIG. 2. In the piezoelectric resonator 11, a monolithic body is formed by alternately depositing an odd number of piezoelectric plates 12 made of piezoelectric ceramics and an even number of electrode films 13a, 13b, 13c, and 13d. Each piezoelectric plate 12 preferably has substantially the same length edges L1 and L2 and the same thickness t, and polarization processing in the thickness direction is performed thereon so that piezoelectric vibration in an extensional mode is excited. Although the polarization direction of each piezoelectric plate 12 is alternating in opposite directions as shown by arrows in FIG. 3B, they may all be in the same direction. Among the deposited electrode films, the two external electrode films are surface electrodes 13a and 13d while electrode films sandwiched between piezoelectric plates 12 are internal electrodes 13b and 13c. The surface electrodes 13a and 13d and the internal electrodes 13b and 13c are arranged to be extended in opposite directions at every layer. That is, the surface electrode 13a and the internal electrode 13c, which are disposed one-layer apart from each other, extend to a first side surface of the monolithic body while being separated from the other side surface thereof. The other surface electrode 13d and the internal electrode 13b, which are also disposed one-layer apart from each other, extend to the other side surface of the monolithic body while being separated from the first side surface thereof.

In nodal points (nodes of extensional vibration) positioned approximately at the central portions of both side surfaces of the monolithic body, side surface electrodes 14a and 14b are preferably provided. One surface electrode 13a and the internal electrode 13c are electrically connected together by one side surface electrode 14a while the other surface electrode 13d and the internal electrode 13b are electrically connected together by the other side surface electrode 14b. The extensional vibration generated in the piezoelectric plates 12 during excitation of the piezoelectric resonator 11 is not affected or damped by the arrangement of side surface electrodes 14a and 14b at the nodal points of the monolithic body.

Figure 1A:
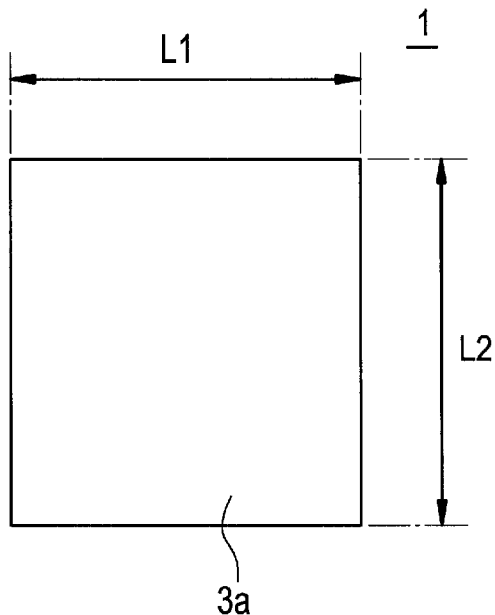
FIG. 1A is a plan view of conventional piezoelectric resonator vibrating in an extensional vibration mode.
Figure 1B:
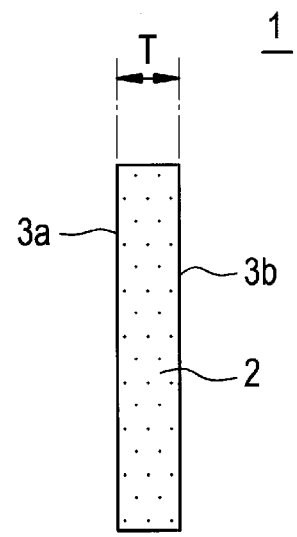
FIG. 1B is a side view of a conventional piezoelectric resonator vibrating in an extensional vibration mode.

When the number of deposited plates of the piezoelectric plates 12 is n, since the piezoelectric resonator 11, constructed as described above, is equivalent to the combination of n plates of the single-plate piezoelectric resonator 1 shown in FIG. 1 connected together in parallel, the capacitance across terminals Cf of the piezoelectric resonator 11 is defined by the following equation (8):

$$Cf = n(\epsilon_o \cdot \epsilon_s \cdot W1 \cdot W2)/t \quad (8),$$

wherein t=thickness of the piezoelectric plates 12; W1(<L1), W2(<L2)=lengths of edge-regions where electrode films overlap with each other; $\epsilon_o$=dielectric constant under vacuum; and $\epsilon_s$=specific dielectric constant of the piezoelectric plates 12.

When considering the single-plate piezoelectric resonator 1 of FIG. 1 and the deposited piezoelectric resonator 11 of FIG. 2, it is assumed that external sizes (L1 and L2) and piezoelectric materials (i.e., specific dielectric constants $\epsilon_s$) of both the piezoelectric resonators 1 and 11 are the same. It is also assumed that electrode films are provided on roughly the whole area of the piezoelectric plates 12 so that L2≅W2 and L1=W1. Since the thickness of both the piezoelectric resonators 1 and 11 is the same, there is the relationship T=nt between the thickness T of the piezoelectric resonator 1 and the thickness t of the piezoelectric plate 12. Therefore, when comparing the equation (1) with the equation (8), it is understood that in the piezoelectric resonator 11 having the n deposited piezoelectric plates 12, the $n^2$-fold capacitance Cf across terminals relative to that of the single-plate piezoelectric resonator 1 can be obtained. For example, in the piezoelectric resonator 11 having three deposited piezoelectric plates 12, the nine-fold capacitance Cf across terminals compared with that of the single-plate piezoelectric resonator 1 having the same size can be obtained. Accordingly, in the piezoelectric resonator 11 according to preferred embodiments of the present invention, a large capacitance Cf across terminals is achieved without changing the resonance frequency and other piezoelectric characteristics of the piezoelectric resonator 11. Furthermore, even when the thickness of the piezoelectric plate 12 is to be 1/n, since it is unitarily deposited, the piezoelectric plates 12 are prevented from cracking.

Figure 4:
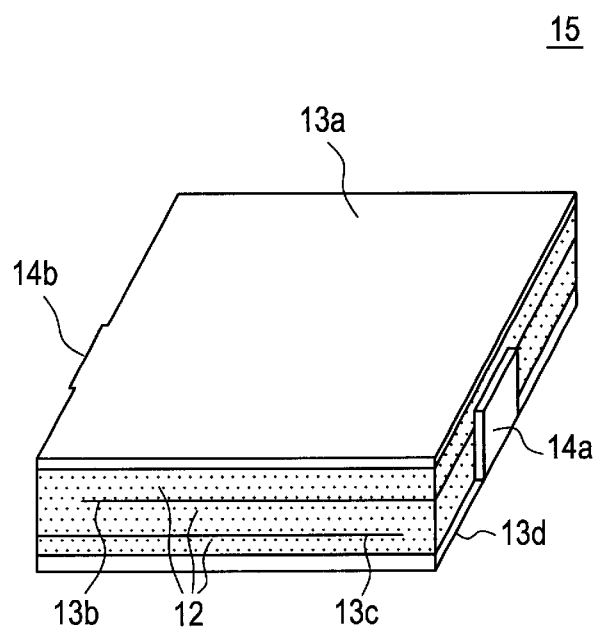
FIG. 4 is a perspective view of a piezoelectric resonator according to another preferred embodiment of the present invention.

In addition, the external electrodes 13a and 13d may be disposed on the whole area of the principal planes of the piezoelectric plates 12, as in a piezoelectric resonator 15 shown in FIG. 4. In this case, as shown in FIG. 4, it is required that the side surface electrode 14a located on the side surface of the monolithic body is withdrawn from one surface of the monolithic body so as not to touch the surface electrode 13d at the side surface, while the side surface electrode 14b is withdrawn from the other surface of the monolithic body so as not to touch the surface electrode 13a at the side surface.

Figure 5A:
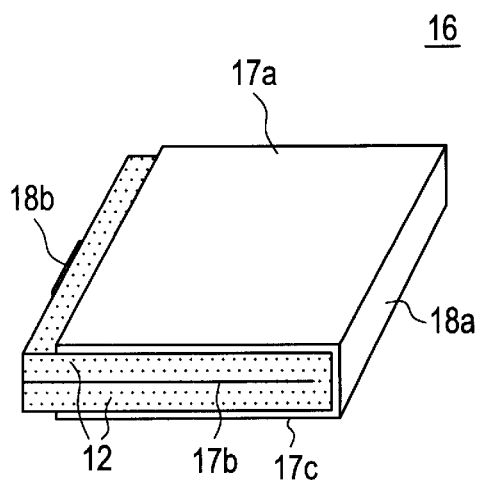
FIG. 5A is a perspective view of a piezoelectric resonator according to another preferred embodiment of the present invention.
Figure 5B:
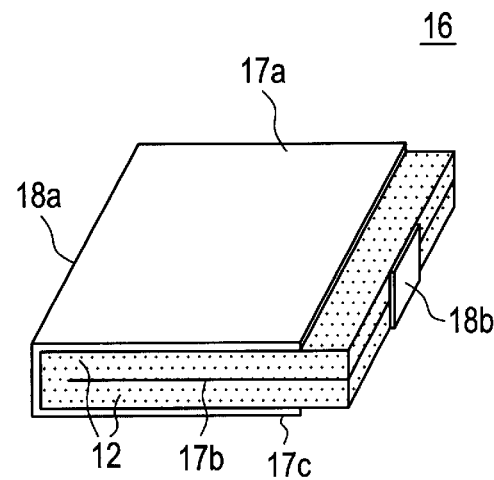
FIG. 5B is a perspective view of a piezoelectric resonator according to another preferred embodiment of the present invention.

In the present preferred embodiment, the monolithic body is preferably made from an odd number of piezoelectric plates and even number of electrode films. However, the monolithic body may be made from an even number of piezoelectric plates and odd number of electrode films. A piezoelectric resonator 16 shown in FIG. 5 is a preferred embodiment of the latter case where surface electrodes 17a and 17c are connected together by a first side surface electrode 18a located on a first side surface of a monolithic body. In the present preferred embodiment, the first side surface electrode 18a is disposed on the whole area of the first side surface while the other side surface electrode 18b is disposed only at the nodal point portion. However, both of the side surface electrodes 18a and 18b may be disposed on the whole area of the side surfaces or they may be disposed only at the nodal point portions.

Figure 6:
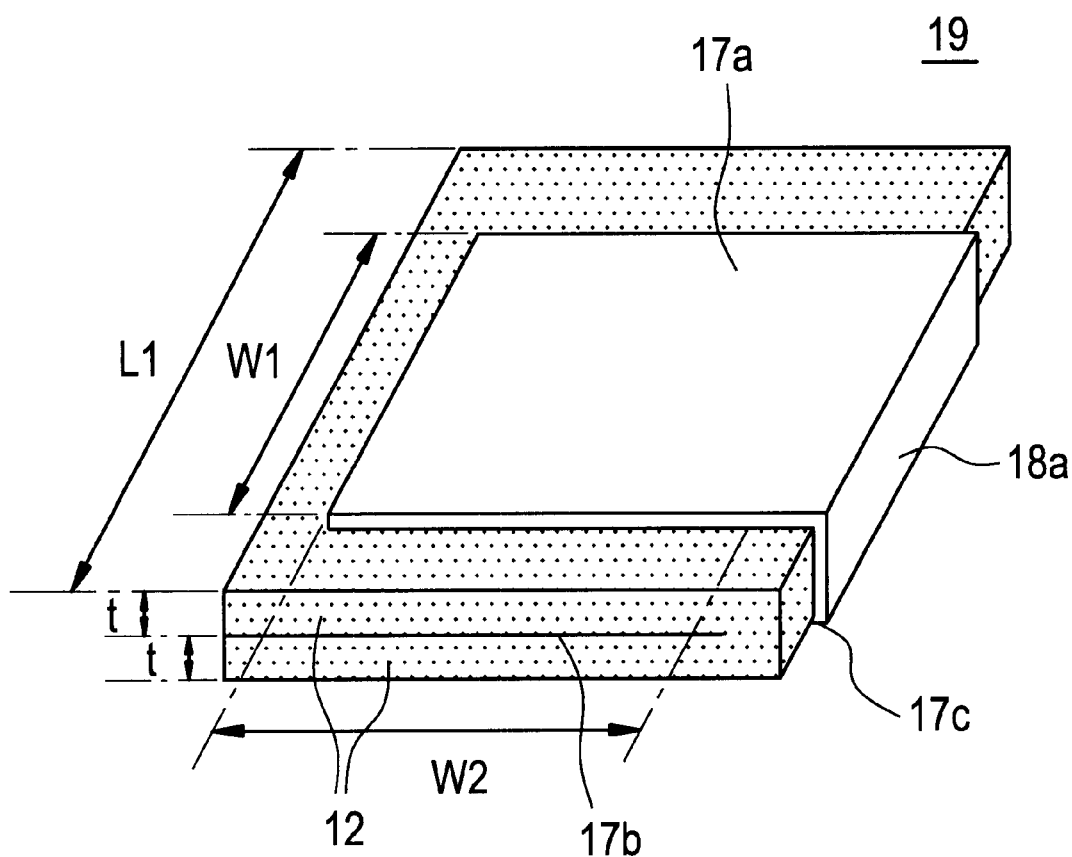
FIG. 6 is a perspective view of a piezoelectric resonator having another preferred embodiment of the present invention.

In the piezoelectric resonator 19 shown in FIG. 6, the width W1 of the surface electrodes 17a and 17c may be smaller than the width L1 of the piezoelectric plates 12 so as to be partial electrodes. This may be, in the case of odd number piezoelectric plates 12 or in the case of even number piezoelectric plates. In any case, the capacitance Cf across terminals of the piezoelectric resonator 19 is provided by equation (8). When the width WI of the surface electrodes 17a and 17c is reduced to be smaller than the width L1 of the piezoelectric plates 12 in such a manner, the value of the capacitance Cf across terminals can be freely adjusted by the width W1 of the surface electrodes 17a and 17c.

Figure 7A:
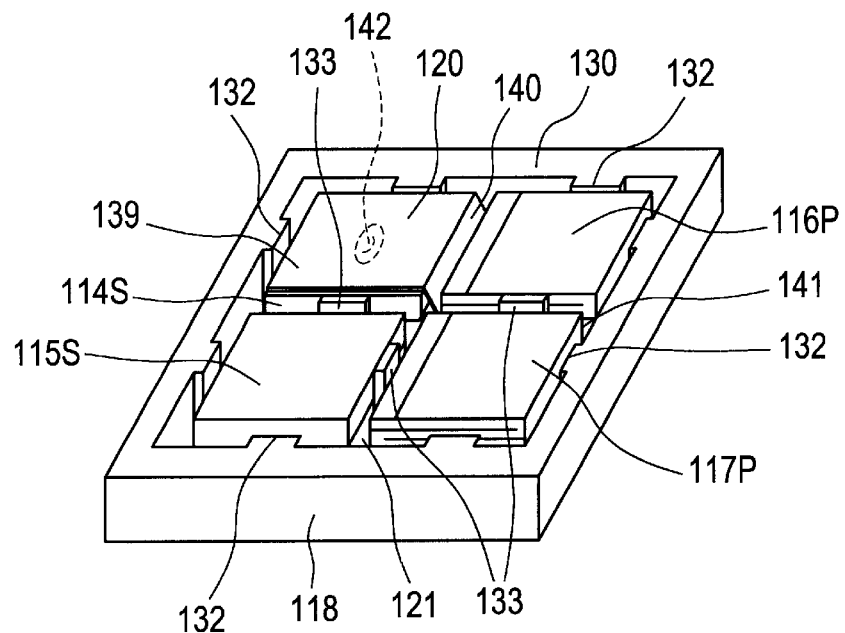
FIG. 7 is perspective view of a ladder filter with the base separated from a case according to another preferred embodiment of the present invention.
Figure 7B:
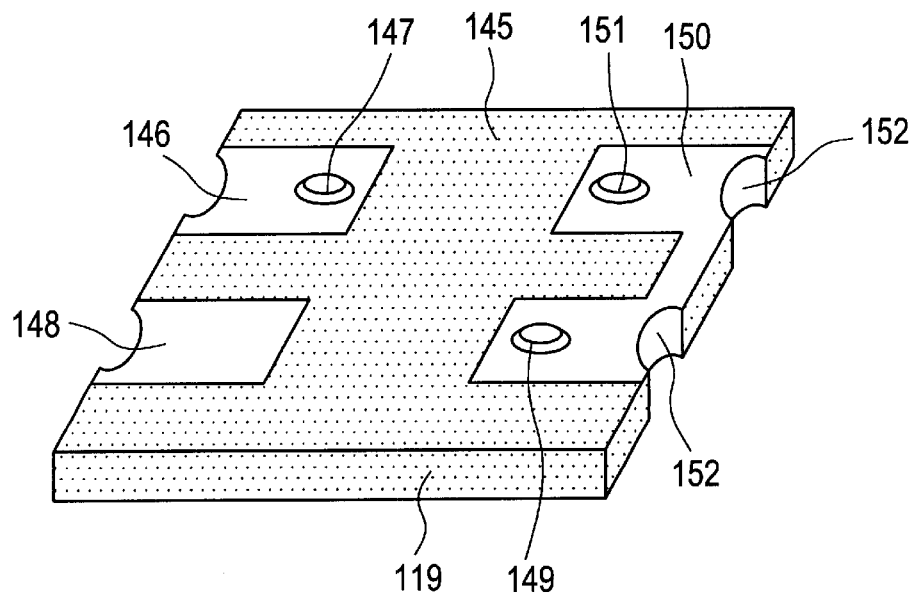
Figure 8:
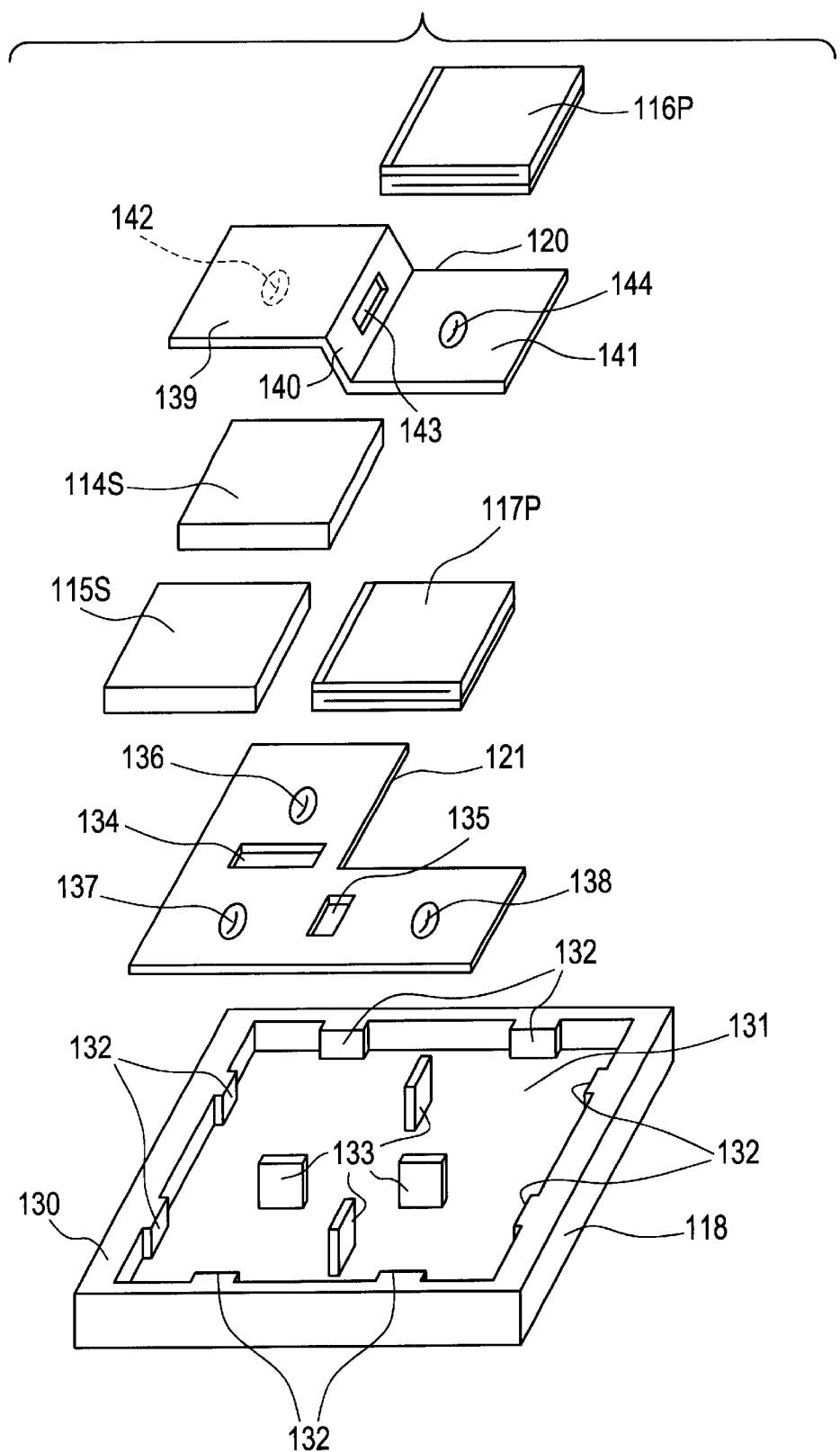
FIG. 8 is an assembly view of the ladder filter of FIG. 7 without the base.

FIG. 7 includes perspective views of a ladder filter according to another preferred embodiment of the present invention, and which show the device where a base 119 is separated from a case 118 accommodating series-connected resonators 114S and 115S and parallel-connected resonators 116P and 117P as piezoelectric elements. FIG. 8 includes perspective views showing the series-connected resonators 114S and 115S and the parallel-connected resonators 116P and 117P in the case 118 and terminal fitting pieces 120 and 121 in separated states. In the FIGS. 7 and 8, the case 118 is shown in a state in which the bottom surface thereof is arranged in an upward direction. As understood from the drawing, in this ladder filter, the series-connected two resonators 114S and 115S and the parallel-connected two resonators 116P and 117P are accommodated in the case 118 and the resonators 114S, 115S, 116P, and 117P are electrically connected therebetween via the terminal fitting pieces 120 and 121.

Figure 10:
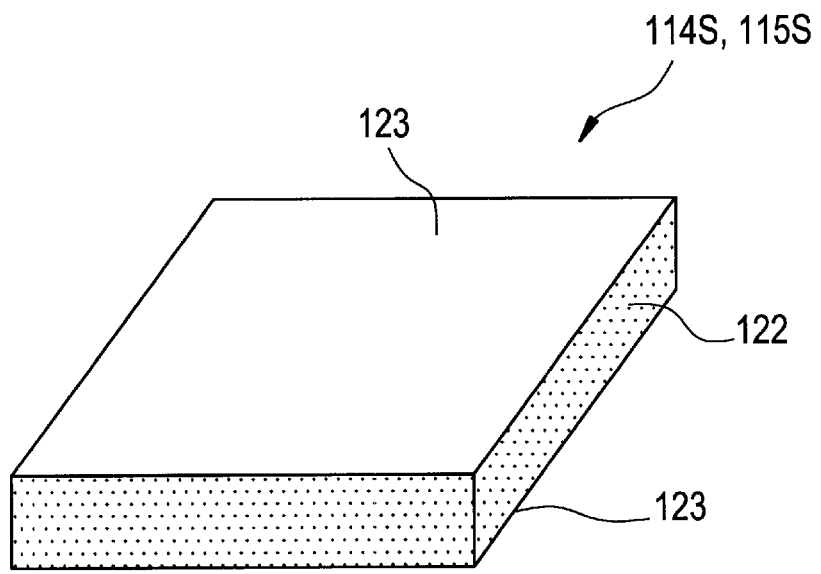
FIG. 10 is a perspective view of the series-connected resonator in a ladder filter according to a preferred embodiment of the present invention.
Figure 11:
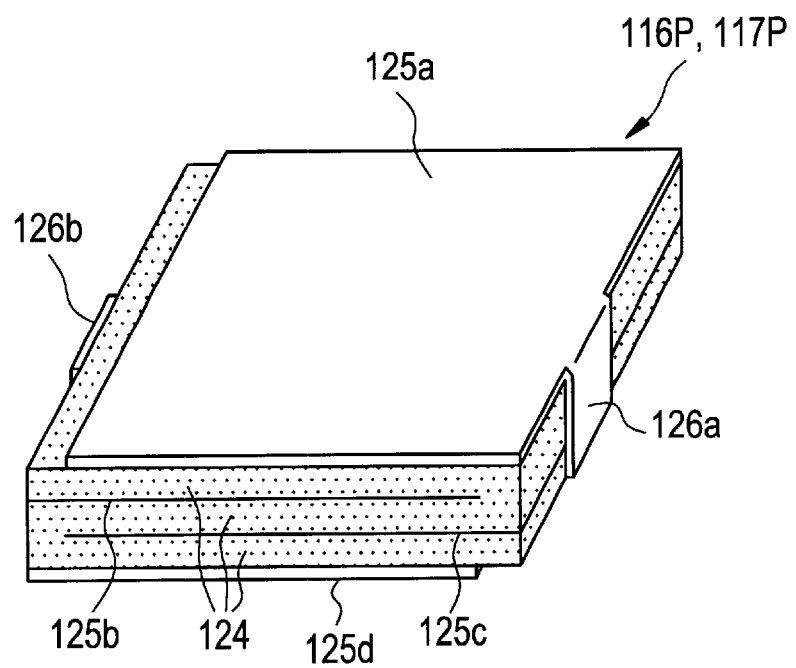
FIG. 11 is a perspective view of the parallel-connected resonator in a ladder filter according to a preferred embodiment of the present invention.
Figure 12A:
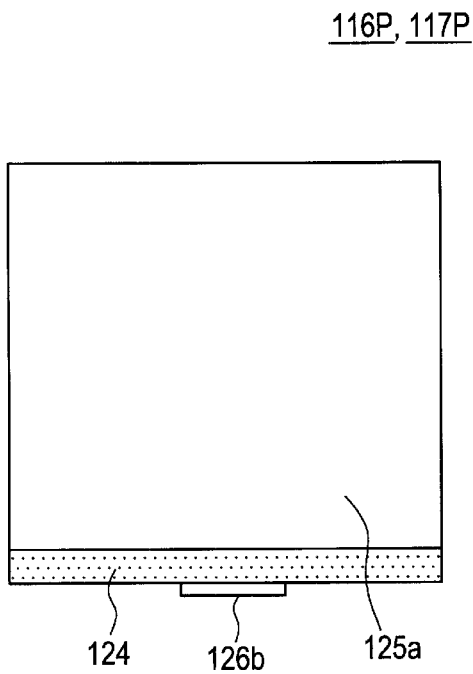
FIG. 12A is a plan view of the parallel-connected resonator shown in FIG. 11.
Figure 12B:
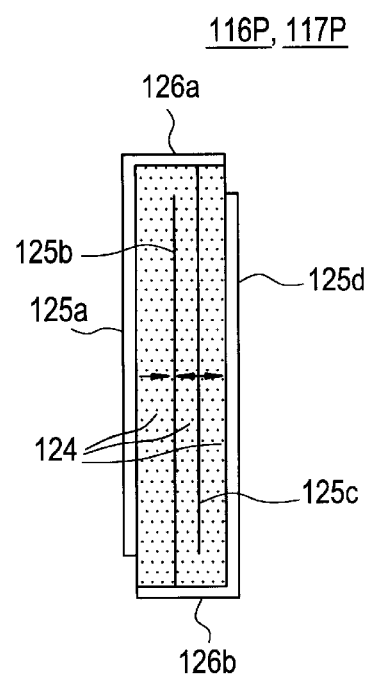
FIG. 12B is a side view of the parallel-connected resonator shown in FIG. 11.
Figure 12C:
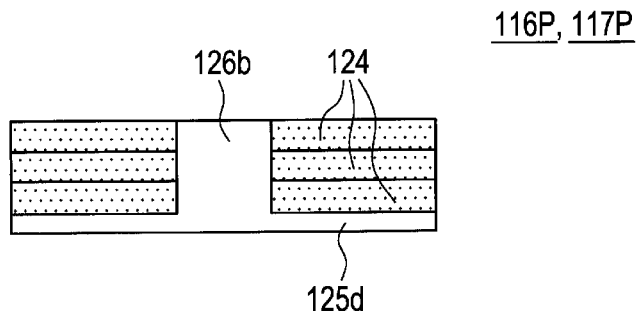
FIG. 12C is a front view of the parallel-connected resonator shown in FIG. 11.

First, the structure of the series-connected resonators 114S and 115S used therein and that of the parallel-connected resonators 116P and 117P will be described. As shown in FIG. 10, the series-connected resonators 114S and 115S preferably include a substantially rectangular piezoelectric plate 122 preferably made from piezoelectric ceramics and electrode films 123 disposed on both principal planes of the piezoelectric plate 122, wherein polarization processing in the thickness direction is performed thereon so that piezoelectric vibration in an extensional mode is excited.

The parallel-connected resonators 116P and 117P have the structure shown in FIG. 11 and FIGS. 12A, 12B, and 12C. In the parallel-connected resonators 116P and 117P, a monolithic body is formed preferably by alternately depositing an odd number of substantially rectangular piezoelectric plates 124 made of piezoelectric ceramics and an even number of electrode films 125a, 125b, 125c, and 125d. In each of the piezoelectric plates 124, polarization processing in the thickness direction is performed thereon so that piezoelectric vibration in an extensional mode is excited. Although the polarization direction of each piezoelectric plate 124 is alternating in opposite directions as shown by arrows in FIG. 12B, it may all be in the same direction. Among deposited electrode films, two external electrode films are surface electrodes 125a and 125d while electrode films sandwiched between piezoelectric plates 124 are internal electrodes 125b and 125c. The surface electrodes 125a and 125d and the internal electrodes 125b and 125c are arranged to extend in opposite directions at every layer. That is, the surface electrode 125a and the internal electrode 125c, which are disposed one-layer apart from each other, extend to a first side surface of the monolithic body while being separated from the other end surface thereof. The other surface electrode 125d and the internal electrode 125b, which are also disposed one-layer apart from each other, extend to the other side surface of the monolithic body while being separated from the first side surface thereof.

At nodal points (nodes of extensional vibration) positioned at the central portions of both side surfaces of the monolithic body, side surface electrodes 126a and 126b are provided. A first surface electrode 125a and the internal electrode 125c are electrically connected together by a first side surface electrode 126a while the other surface electrode 125d and the internal electrode 125b are electrically connected together by the other side surface electrode 126b. The extensional vibration generated in the piezoelectric plates 124 during excitation of the parallel-connected resonators 116P and 117P is not affected by arranging side surface electrodes 126a and 126b at the nodal point portions of the monolithic body in such a manner. In addition, the parallel-connected resonators 116P and 117P may be unitary sintered bodies as well as deposited piezoelectric plates 124.

When the parallel-connected resonators 116P and 117P of such a monolithic structure are used, the capacitance across terminals of the parallel-connected resonators 116P and 117P is greatly increased without using different materials from that of the series-connected resonators 114S and 115S or without having different sizes from that of the series-connected resonators 114S and 115S. Therefore, the ratio of the capacitance across terminals of the parallel-connected resonators 116P and 117P to the capacitance across terminals of the series-connected resonators 114S and 115S is also greatly increased so that the guaranteed attenuation of the ladder filter can be increased. Even when the thickness of each piezoelectric plate 124 is reduced, the total thickness of the parallel-connected resonators 116P and 117P is not changed, so that the strength of the parallel-connected resonators 116P and 117P is not likely to be reduced. For example, when the parallel-connected resonators 116P and 117P of the monolithic structure are formed using n plates of the piezoelectric plate 124 having a 1/n thickness, the capacitance across terminals thereof is increased $n^2$-fold and the guaranteed attenuation of the ladder filter is also increased $n^2$-fold.

As shown in FIG. 8, on the bottom surface of the case 118, a recessed portion 131 for accommodating the two series-connected resonators 114S and 115S and the two parallel-connected resonators 116P and 117P so as to arrange them in one plane is provided. The recessed portion 131 is surrounded by a frame portion 130. On the internal wall surface of the recessed portion 131 (internal surface of the frame portion 130), protruding portions 132 for positioning each of resonators 114S, 115S, 116P, and 117P are provided while on the ceiling surface of the recessed portion 131, protruding pieces 133 for positioning each of resonators 114S, 115S, 116P, and 117P are provided. The protruding pieces 133 also have the function for positioning the terminal fitting pieces 120 and 121.

A first terminal fitting piece 121, having a planar and roughly an L-shape, and having about three times as large an area as that of the resonators includes three convex portions 136, 137, and 138 provided on the top surface thereof and openings 134 and 135 for passing through the protruding pieces 133 disposed between the convex portions 136, 137, and 138. The other terminal fitting piece 120, having about twice the area of the resonators, includes plane portions 139 and 141, each having a different height from each other, arranged on both sides and an inclined piece 140 connecting the plane portions 139 and 141 together. On the bottom surface of the first plane portion 139 of the terminal fitting piece 120 and on the top surface of the other plane portion 141, convex portions 142 and 144 are respectively provided, while an opening 143 for passing through the protruding piece 133 is provided in the inclined piece 140.

Figure 9:
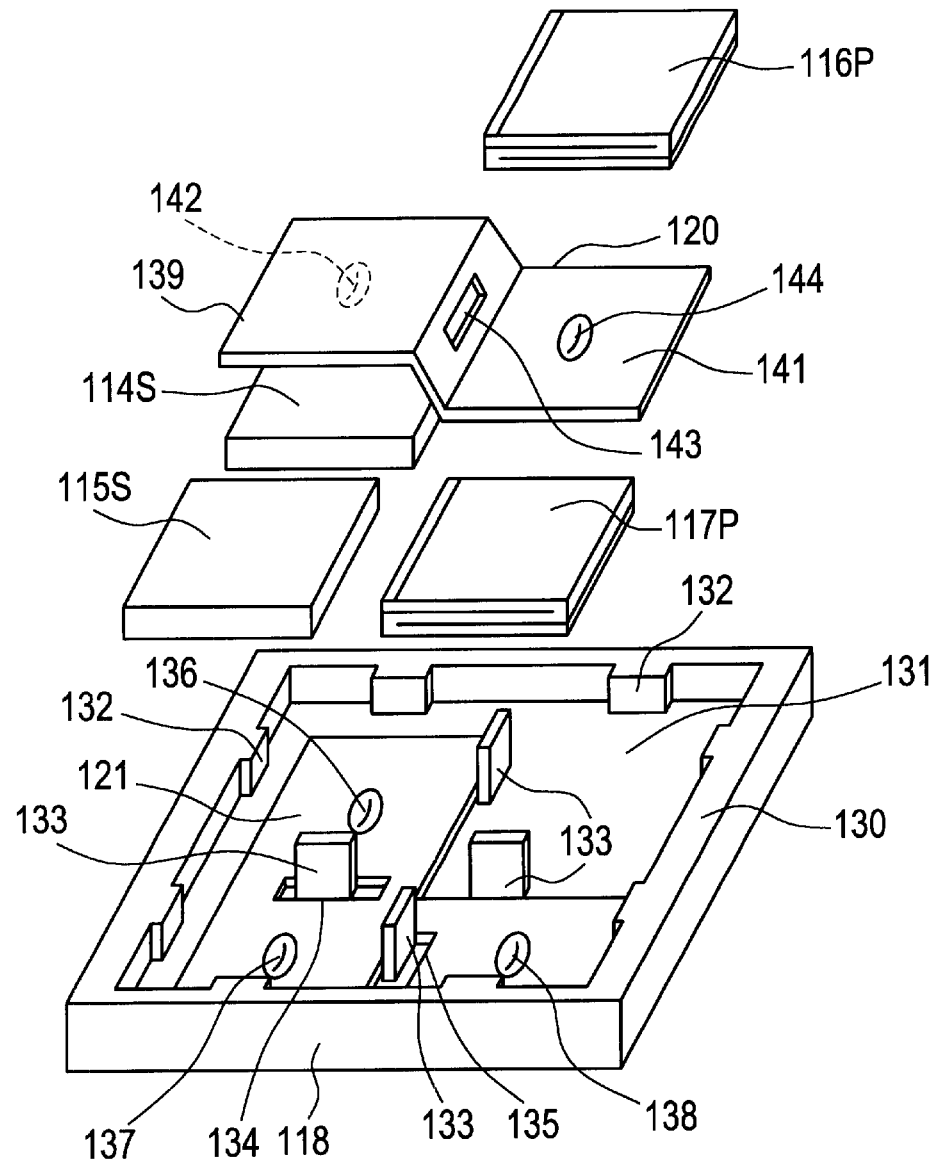
FIG. 9 is a perspective view of the ladder filter of FIG. 8 showing one of the terminal electrodes being provided in the case.

Thus, when assembling, as shown in FIG. 9, the planar terminal fitting piece 121 is accommodated in the recessed portion 131 of the case 118 so that the protruding pieces 133 are passed through the openings 134 and 135. Then, the two series-connected resonators 114S and 115S and the parallel-connected resonator 117P are placed on the terminal fitting piece 121. At this time, the two series-connected resonators 114S and 115S and the parallel-connected resonator 117P are positioned by the convex portions 132 disposed in the internal periphery of the frame portion 130 and the protruding pieces 133. Then, the protruding piece 133 is passed through the opening 143 and the one plane portion 139 is laid on the series-connected resonator 114S, so that the terminal fitting piece 120 is accommodated in the case 118. Then, as shown in FIG. 7, the rest of parallel-connected resonator 116P is laid on the other plane portion 141. This parallel-connected resonator 116P is also positioned by the convex portions 132 disposed in the internal periphery of the frame portion 130 and the protruding pieces 133.

In addition, the convex portions 132 and the protruding pieces 133 positioning the series-connected resonators 114S and 115S and the parallel-connected resonators 116P and 117P touch each of resonators 114S, 115S, 116P, and 117P at each approximately central edge portion of the external peripheral surface, which is a nodal point of resonator vibration, so that extensional vibration of each of resonators 114S, 115S, 116P, and 117P is not affected or damped.

The base 119 includes a substrate 145 preferably made from a glass-epoxy resin substrate or an alumina substrate and electrode portions disposed on the top and bottom surfaces of the substrate 145. As shown in FIG. 7, on the top surface of the substrate 145, an input electrode portion 146, an output electrode portion 148, and a ground electrode portion 150 are formed by burning copper foil or conductive paste or other similar substances. On the input electrode portion 146 and the ground electrode portion 150, convex portions 147, 149, and 151 are provided at corresponding positions to those opposing each resonator center by adding conductive paste or conductive adhesive thereto by printing or dispenser or other similar methods. Since irregularity in height of the convex portions 147, 149, and 151 may cause electrical contact failures, they are polished so as to make them the same height. On the bottom surface of the base 119, an input electrode portion, an output electrode portion, and a ground electrode portion (not shown) are similarly provided as in the top surface. The input electrode portions, the output electrode portions and the ground electrode,portions on the top and bottom surfaces are respectively connected electrically together via side surface electrodes 152 formed using through-holes.

After an adhesive is coated on the bottom surface of the frame portion 130 of the case 118 accommodating the series-connected resonators 114S and 115S, the parallel-connected resonators 116P and 117P, and the terminal fitting pieces 120 and 121, the base 119 is laid on the case 118 such that the top surface of the base 119 is oriented in a downward direction. Each of resonators 114S, 115S, 116P, and 117P is elastically sandwiched between the case 118, the terminal fitting pieces 120 and 121, and the base 119 by pressing from the top side of the base 119. Then, heat is applied thereto in this state to cure the adhesive. Each of resonators 114S, 115S, 116P, and 117P is shielded between the base 119 and the case 118 by joining the bottom surface of the frame portion 130 to the base 119 via the adhesive.

When the base 119 is joined to the case 118 in such a manner, the convex portions of the base 119 and the convex portion 147 elastically abuts the principal plane of the series-connected resonator 115S. The output electrode portion 148 elastically abuts the plane portion 139 of the terminal fitting piece 120; and the convex portions 149 and 151 of the ground electrode portion 150 touch the principal planes of both the parallel-connected resonators 116P and 117P, respectively. Also, the input-side series-connected resonator 115S is clamped by the convex portion 147 of the input electrode portion 146 and the convex portion 137 of the terminal fitting piece 121 at the central portions of the resonator principal planes. The output-side series-connected resonator 114S is clamped by the convex portion 142 of the terminal fitting piece 120 and the convex portion 136 of the terminal fitting piece 121 at the central portions of the resonator principal planes. The parallel-connected resonators 116P and 117P are, respectively, clamped by the convex portions 149 and 151 of the ground electrode portion 150 and the convex portions 144 and 138 of respective terminal fitting pieces 120 and 121, at the approximate central portions of the resonator principal planes.

Figure 13:
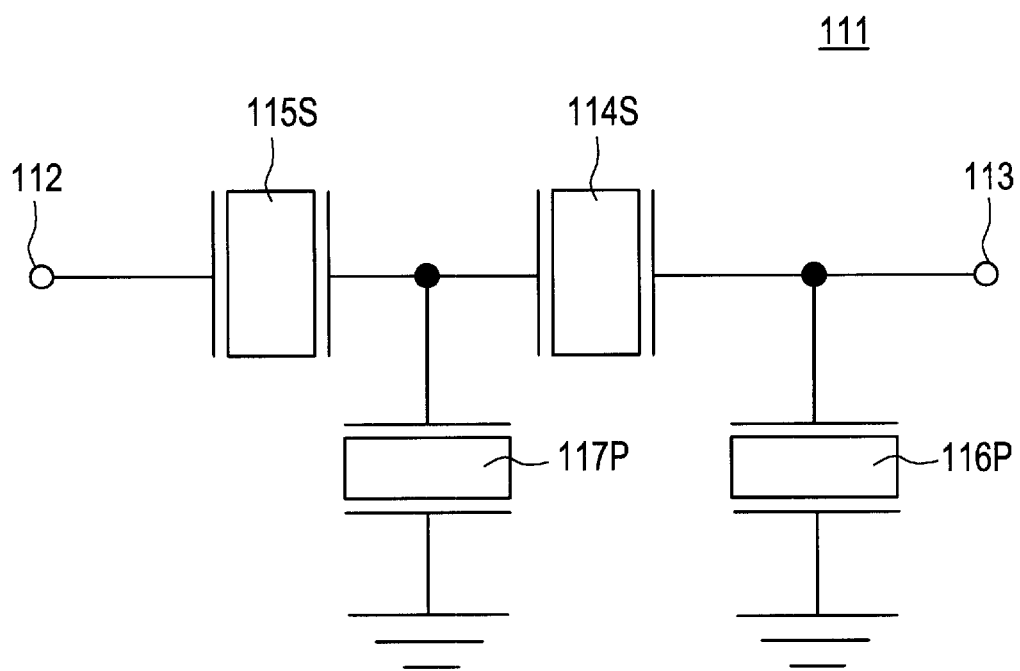
FIG. 13 is a circuit diagram of a ladder filter according to a preferred embodiment of the present invention.

Consequently, the series-connected resonators 114S and 115S and the parallel-connected resonators 116P and 117P are connected in ladder-type connection to provide a ladder filter 111. That is, as shown in FIG. 13, two series-connected resonators 114S and 115S are connected together in series between an input-terminal 112 (input electrode portion) and an output-terminal 113 (output electrode portion) while two parallel-connected resonators 116P and 117P are respectively inserted between each of the output sides of the respective series-connected resonators 114S and 115S and the ground. In such a ladder filter for use as a second IF filter of a communication apparatus, for example, only the one used in up to 450 kHz has been conventionally produced. However, according to preferred embodiments of the present invention, a high frequency filter used up to 900 kHz, which is twice the conventional one (600 to 1,000 kHz, for example) can be achieved.

When the ladder filter produced in this manner is used for a component, it is arranged on the base 119 in the downward orientation and the case 118 in the upward direction and the bottom surface of the base 119 is mounted on a circuit board.

Since this ladder filter has a structure such that resonators 114S, 115S, 116P, and 117P are arranged in one plane, a low profile component (not more than 2 mm in height of the product, for example) is achieved. Furthermore, the conventional ladder filter has a structure that is arranged such that the opening portion of the case is shielded by a shielding resin, so that the space filled by the shielding resin occupies a large volume resulting in a large-size ladder filter. However, the above-mentioned ladder filter has the structure that is arranged such that the base 119 is joined to the case 118, so that the modification into a low profile is further achieved. When the ladder filter modified into a low profile in such a manner is mounted on a circuit board, the mounting height is significantly reduced so as to contribute to modification into low-profile apparatuses.

The filter can be assembled preferably by arranging the series-connected resonators 114S and 115S and the parallel-connected resonators 116P and 117P in the case 118 without stacking the resonators vertically on top of each other as in the conventional filters, so that preferred embodiments of the present invention are also suitable for automatic assembling.

In a ladder filter including four resonator elements, although a conventional filter is required to have four to five terminal fitting pieces, the ladder filter according to preferred embodiments of the present invention only requires two terminal fitting pieces because of the arrangement of each of resonators 114S, 115S, 116P, and 117P in a plane. Also, in the ladder filter according to preferred embodiments of the present invention, the shape of the terminal fitting pieces is also simplified, thereby reducing the cost of the ladder filter and enabling it to be readily assembled as well.

Furthermore, in a conventional ladder filter, external electrodes are formed by bending lead portions of metallic terminals, so that bending failure of the metallic terminal often occurs so that soldering failure is likely to be produced during mounting. However, in the ladder filter according to preferred embodiments of the present invention, since electrode portions are provided on the bottom surface of the base with conductive films, flatness of the bottom surface (mounting surface) of the ladder filter is improved, so that soldering failure does not occur during surface mounting.

Although preferred embodiments of the present invention have been described in the context of ladder filters, the present invention is not limited to ladder filters and it may be applied to various piezoelectric components for surface mounting other than ladder filters.

Figure 14:
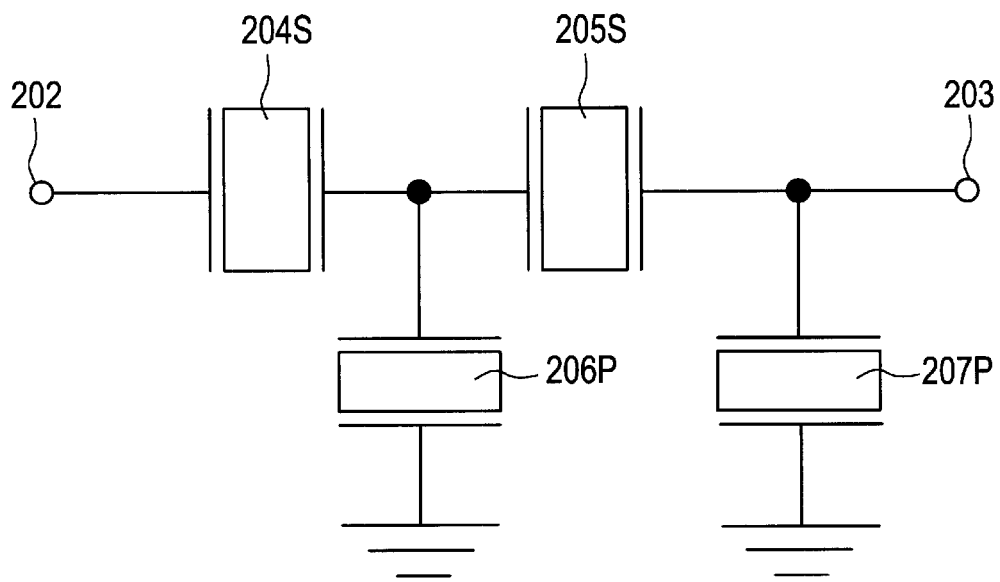
FIG. 14 is a circuit diagram of a conventional two-stage ladder filter.
Figure 17:
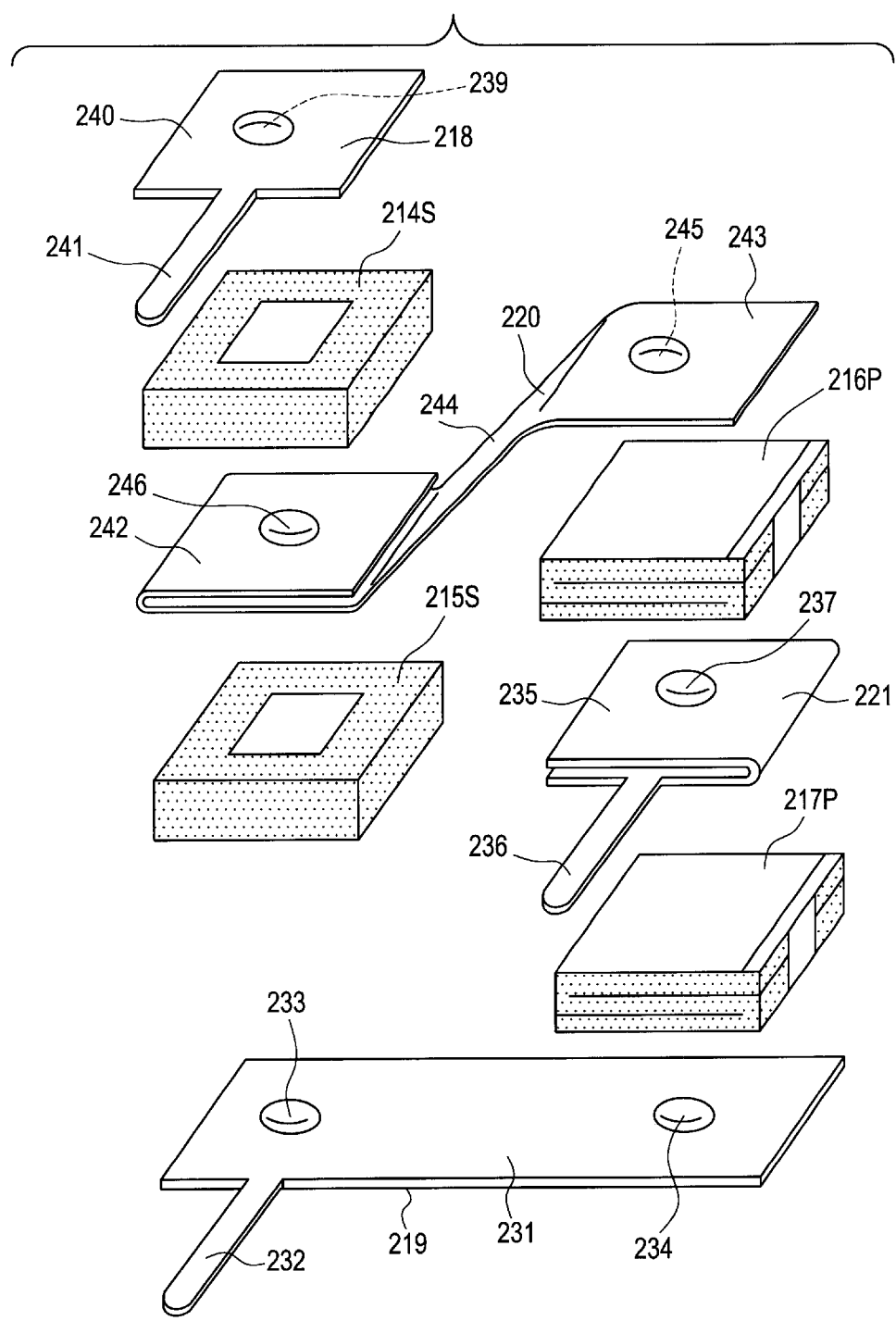
FIG. 17 is an assembly view of the ladder filter shown in FIG. 16 without a case.

FIG. 16 is a front view showing the internal structure of a ladder filter 211 according to another preferred embodiment of the present invention in a state in which a lid 213 is removed from a case 212. FIG. 17 includes perspective views showing structures of series-connected resonators 214S and 215S, parallel-connected resonators 216P and 217P, and four terminals 218, 219, 220, and 221, which are contained therein. FIG. 18 includes perspective views showing the case 212 and the lid 213 thereof. As understood from these drawings, in the ladder filter 211, the two series-connected resonators 214S and 215S and the two parallel-connected resonators 216P and 217P are accommodated in the case 212 and the resonators 214S, 215S, 216P, and 217P are electrically connected together with the terminals 218 to 221, so that a ladder including two-stages is provided similar to FIG. 14.

First, the structures of the series-connected resonators 214S and 215S and the parallel-connected resonators 216P and 217P included therein will be described. As shown in FIG. 19, the series-connected resonators 214S and 215S are energy-trap type resonators having a piezoelectric plate 222 made of piezoelectric ceramics and electrode films 223 disposed at approximate central portions of both principal planes of the piezoelectric plate 222, and polarization processing in the thickness direction is performed thereon, so that piezoelectric vibration in an extensional mode is excited.

In such, the series-connected resonators 214S and 215S, the capacitance Cfs across terminals thereof is defined by the following equation (9), $$Cf_s = (\epsilon_o \cdot \epsilon_s \cdot W_s^2)/T \qquad (9),$$

wherein T is the thickness of the piezoelectric plate 222; $W_s$ is the edge length of the electrode film 223 (wherein the edge length of the series-connected resonator is $L_s$, $W_s \leq L_s$); $\epsilon_o$ is the dielectric constant under vacuum; and $\epsilon_s$ is the specific dielectric constant of the piezoelectric plate 222.

The parallel-connected resonators 216P and 217P have a structure as shown in FIG. 20 and FIGS. 21A, 21B, and 21C. In the parallel-connected resonators 216P and 217P, a monolithic body is formed preferably by alternately depositing an odd number of substantially rectangular piezoelectric plates 224 made from piezoelectric cerarmics and an even number of electrode films 225a, 225b, 225c, and 225d. Polarization processing in the thickness direction is performed on the piezoelectric plates 224, so that piezoelectric vibration in an extensional mode is generated. Although the polarization direction of each piezoelectric plate 224 alternates in the opposite direction as shown by arrows in FIG. 21B, it may be all the same direction. Among the deposited electrode films, two external electrode films are surface electrodes 225a and 225d while electrode films sandwiched between piezoelectric plates 224 are internal electrodes 225b and 225c. The surface electrodes 225a and 225d and the internal electrodes 225b and 225c are arranged to be extended in opposite directions at every layer. That is, the surface electrode 225a and the internal electrode 225c, which are disposed one-layer apart from each other, extend to a first side surface of the monolithic body while being separated from the other side surface thereof. The other surface electrode 225d and the internal electrode 225b, which are disposed one-layer apart from each other, extend to the other side surface of the monolithic body while being separated from the first side surface thereof. In addition, the parallel-connected resonators 216P and 217P may be unitary, sintered bodies.

At nodal points (nodes of extensional vibration) positioned at the approximate central portion of both side surfaces of the monolithic body, side surface electrodes 226a and 226b are provided. One surface electrode 225a and the internal electrode 225c are electrically connected together by one side surface electrode 226a while the other surface electrode 225d and the internal electrode 225b are electrically connected together by the other side surface electrode 226b. The extensional vibration generated in the piezoelectric plate 224 during excitation of the parallel-connected resonators 216p and 217p is not damped or affected because the side surface electrodes 226a and 226b are arranged at the nodal points of the monolithic body.

The capacitance $Cf_p$ across terminals of the parallel-connected resonators 216p and 217p of such the monolithic structure is defined by the following equation (10), when the number of deposited plates of the piezoelectric plate 224 is n, $$Cf_p = n(\epsilon_o \cdot \epsilon_p \cdot W_p1 \cdot W_p2)/t \qquad (10),$$

wherein t=thickness of the piezoelectric plate 224; $W_p1$ and $W_p2$ lengths of edge-regions where electrode films 225a to 225d overlap with each other (when the edge length of the parallel-connected resonator is $L_p$, $W_p1 \leq L_p$, $W_p2 \leq L_p$); $\epsilon_o$=dielectric constant under vacuum; and $\epsilon_p$=specific dielectric constant of the piezoelectric plate 224.

Figure 15:
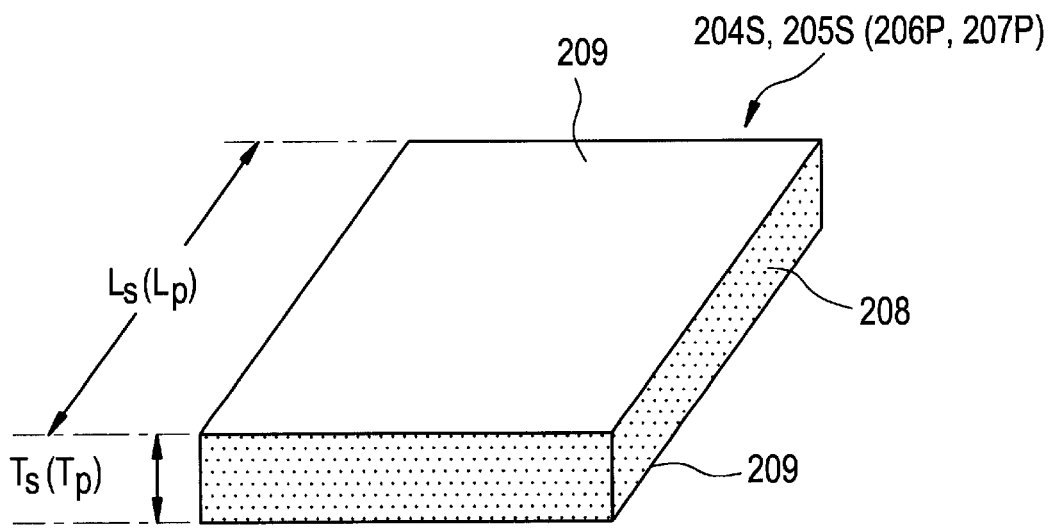
FIG. 15 is a perspective view of the series-connected resonators and the parallel-connected resonators included in a conventional ladder filter.

When considering the series-connected resonators 204s and 205s as shown in FIG. 15 and the series-connected resonators 214s and 215s as shown in FIG. 19, it is assumed that external sizes ($L_s \cong 2.2$ mm, for example) and piezoelectric materials (i.e., specific dielectric constants $\epsilon_s$) of both the series-connected resonators 204s, 205s, 214s, and 215s are the same. It is also assumed that the thickness T of both the series-connected resonators 204s, 205s, 214s, and 215s are the same. Therefore, the ratio of the capacitance across terminals $Cf_s$ of the series-connected resonators 214s and 215s according to preferred embodiments of the present invention and the capacitance across terminals $Cf_{so}$ of the conventional series-connected resonators 204S and 205S is defined by the following equation (11), $$Cf_s/Cf_{so}=(W_s/L_s)^2 \quad (11)$$

Accordingly, in the series-connected resonators 214s and 215s constructed as described above, the small capacitance $Cf_s$ across terminals can be obtained without changing the size $L_s$, the thickness T, and the piezoelectric material of the piezoelectric plate 224.

Also, when considering the parallel-connected resonators 206p and 207p as shown in FIG. 15 and the parallel-connected-resonators 216p and 217p as shown in FIG. 20, it is assumed that external sizes ($L_p \cong 2.3$ mm, for example) and piezoelectric materials (i.e., specific dielectric constants $\epsilon_p$) of both the parallel-connected resonators 206p, 207p, 216p, and 217p are the same. It is also assumed that electrode films 225a to 225d are disposed on roughly the whole area of the piezoelectric plates 224 so that $W_p 2 \cong L_p$ and $W_p 1 L_p$. When the thickness T(0.5 mm, for example) of both the parallel-connected resonators 206p, 207p, 216p, and 217p is substantially the same, there is the relationship T=nt between the thickness T of the parallel-connected resonators 216p and 217p and the thickness t of the piezoelectric plate 224 (when n=3, t$\cong$0.17 mm, for example). Therefore, when comparing equation (5) with equation (10), the ratio of the capacitance $Cf_p$ across terminals of the parallel-connected resonators 216p and 217p having the n deposited piezoelectric plates 224 to the capacitance $Cf_{po}$ across terminals of the parallel-connected resonators 206p and 207p of the single plate structure is defined by the following equation (12), $$Cf_p/Cf_{po}=n_2 \quad (12)$$

For example, in the parallel-connected resonators 216p and 217p having three deposited plates of the piezoelectric plate 224, a nine-fold capacitance Cf across terminals compared with that of the single-plate parallel-connected resonators 206p and 207p having the same size can be obtained. Accordingly, in such a parallel-connected resonators 216p and 217p; a large capacitance $Cf_p$ across terminals can be obtained without changing the size ($L_p$), the thickness T, and piezoelectric material of the parallel-connected resonators 216p and 217p. Furthermore, even when the thickness of the piezoelectric plate 224 is to be 1/n-fold, since it is unitarily deposited, the piezoelectric plates 224 are prevented from cracking.

Consequently, in the two-stage ladder filter 211 including the series-connected resonators 214s and 215s and the parallel-connected resonators 216p and 217p, the guaranteed attenuation ATT can be increased compared with that of the ladder filter made of conventional series-connected resonators 204s and 205s and parallel-connected resonators 206p and 207p. The ratio of the guaranteed attenuation ATT of the ladder filter 211 to the guaranteed attenuation $ATT_o$ of the conventional ladder filter is defined by the following equation (13), $$ATT/ATT_o=[W_s/(n \cdot L_s)]^2 \quad (13).$$

Therefore, a guaranteed attenuation ATT that is larger than the guaranteed attenuation $ATT_o$ of the conventional ladder filter can be achieved by reducing the electrode area $W_s \times W_s$ of the series-connected resonators 214s and 215s compared with the piezoelectric substrate area $L_s \times L_s$ and increasing the number of layers n of the parallel-connected resonators 216p and 217p.

The structure of the ladder filter including two series-connected resonators 214s and 215s and two parallel-connected resonators 216p and 217p, both the resonators having approximately the same size ($L_s \cong L_p$) and thickness (T), which are compactly accommodated in the case 212, will be described with reference to FIGS. 16 to 18. In the ladder filter 211, two series-connected resonators 214s and 215s and two parallel-connected resonators 216p and 217p are connected together by four terminals, i.e., an input terminal 218, an output terminal 219, an internal electrode terminal 220, and a ground terminal 221. The output terminal 219 includes an electrode plate 231 having the sum of the widths of the series-connected resonator 215s and the parallel-connected resonator 217p and a lead portion 232 extending from the electrode plate 231. On the top surface of the electrode plate 231, a pair of convex portions 233 and 234 are provided on both sides. The ground terminal 221 includes an electrode plate 235 folded into halves for elasticity and a lead portion 236 extending from the electrode plate 235. On both the top and bottom surfaces of the electrode plate 235, convex portions 237 and 238 are respectively provided. The input terminal 218 includes an electrode plate 240 having a convex portion 239 provided on the bottom surface thereof and a lead portion 241 extending therefrom. The internal electrode terminal 220 also has the sum of the widths of the series-connected resonators 214s and 215s and the parallel-connected resonators 216p and 217p, and includes an elastic plane portion 242 at the left and a single plate portion 243 at the right, both of the portions having different heights and approximately corresponding to the element thickness, and an inclined piece 244 connecting the elastic plane portion 242 to the single plate portion 243. On the bottom surface of the single plate portion 243 in the right, a convex portion 245 is provided. The elastic plane portion 242 in the left is folded into halves having convex portions 246 and 247 respectively provided on the top and bottom surfaces thereof.

Thus, as shown in FIGS. 16 and 17, the series-connected resonator 215s and the parallel-connected resonator 217p are located on both sides of the top surface of the output terminal 219, the ground terminal 221 is disposed on the parallel-connected resonator 217p in the right and furthermore, the parallel-connected resonator 216p is disposed on the ground terminal 221. On the series-connected resonator 215s in the left and the parallel-connected resonator 216p in the right upper section, the elastic plane portion 242 of the internal electrode terminal 220 and the single plate portion 243 are respectively disposed. On the elastic plane portion 242 of the internal electrode terminal 220, the series-connected resonator 214s is disposed and the input terminal is disposed on the series-connected resonator 214s.

The series-connected resonators 214s and 215s and the parallel-connected resonators 216p and 217p are arranged in this manner with the terminals 218 to 221 provided in the case 212 having an opening in one end thereof by inserting them from the opening 251 thereof. That is, the series-connected resonator 214S is elastically clamped at the approximate central portions of both the principal planes thereof by the convex portion 239 of the input terminal 218 and the convex portion 246 of the elastic plane portion 242. The series-connected resonator 215S is elastically clamped by the convex portion 247 of the elastic plane portion 242 and the convex portion 233 of the output terminal 219. Also, the parallel-connected resonator 216P is elastically clamped at the approximate, central portions of both the principal planes thereof by the convex portions 245 of the single plate portion 243 and the convex portion 237 of the ground terminal 221. The parallel-connected resonator 217P is elastically clamped by the convex portion 238 of the ground terminal 221 and the convex portion 234 of the output terminal 219. Consequently, a circuit similar to that of the combination of two series-connected resonators 214s and 215s and two parallel-connected resonators 216p and 217p can be obtained to have a two-stage ladder filter 211.

A partition wall 252 is provided on the internal surface of the lid 213 for shielding the opening of the case 212 and divides the case 212 into the series-connected resonators 214s and 215s side, and the parallel-connected resonators 216p and 217p side. The partition wall 252 has a slit 253 for passing through the inclined piece 244 of the internal electrode terminal 220. The lid 213 contains openings 254, 255, and 256 for respectively passing through the lead portion 241 of the input terminal 218, the lead portion 232 of the output terminal 219, and the lead portion 236 of the ground terminal 221. After the series-connected resonators 214s and 215s, the parallel-connected resonators 216p and 217p, and the terminals 218 to 221 are accommodated into the case 212, the lid 213 is fitted in the opening 251 of the case 212 to seal therebetween, for example, with a sealing adhesive. In this manner, the ladder filter 211 having a compact structure without wasted spaces is provided.

In the ladder filter 211 having the above-described structure, since the thickness of the series-connected resonators 214s and 215s and the parallel-connected resonators 216p and 217p is approximately the same within limits of the deformation range of the terminals 218 to 221 in the thickness direction, limitation of arrangement of the series-connected resonators 214s and 215s and the parallel-connected resonators 216p and 217p is reduced, so that it is sufficient only to consider electrical circuit connections. Also, since the capacitance $Cf_p$ across terminals of the parallel-connected resonators 216p and 217p can be designed to be large, the thickness of the series-connected resonators 214s and 215s is greatly reduced so as to significantly reduce the overall size of the ladder filter 211, resulting in miniaturization thereof. The capacitance $Cf_p$ across terminals of the parallel-connected resonators 216p and 217p is increased, so that the impedance of the ladder filter 211 is greatly increased.

When specifically designing a ladder filter having a frequency of about 450 kHz, in a conventional ladder filter, the thickness of elements is used for a parameter for obtaining the desired guaranteed attenuation ATT wherein the thickness of the parallel-connected resonators is determined to be about 280 μm which is at the strength limit against cracking; the thickness of the series-connected resonators is to be about 1,200 μm to obtain the desired capacitance ratio; and so that the thickness ratio between the series-connected resonators and the parallel-connected resonators is designed to be 1,200/280≅4.3. In contrast, in the ladder filter 211 according to preferred embodiments of the present invention, any of the series-connected resonators 214s and 215s and the parallel-connected resonators 216p and 217p has approximately the same thickness of about 500 μm. Therefore, in a four-element and two-stage ladder filter, the conventional one has a total thickness of 2,960 μm. In contrast, the filter according to preferred embodiments of the present invention is preferably constructed to have a total thickness of about 2,000 μm which is about ⅔ thickness of the conventional filter.

In addition, although the thickness of any of the series-connected resonators 214s and 215s and the parallel-connected resonators 216p and 217p is determined to be about 500 μm in the above-mentioned construction, it should be understood that using a smaller thickness than that is possible. It is sufficient to consider only that the thickness is not less than that of the strength limit against impact cracking (about 280 μm).

In accordance with one preferred embodiment of the present invention, since the piezoelectric resonator has a structure in which a plurality of elements vibrating in an extensional mode are deposited, the capacitance across terminals can be increased without changing the sizes of piezoelectric plates and piezoelectric materials. It also has a structure in which plural piezoelectric plates are unitarily deposited, so that the capacitance across terminals can be increased by reducing the thickness of the piezoelectric plate without reducing the strength of the piezoelectric resonator. Therefore, in the piezoelectric resonator according to preferred embodiments of the present invention, a large capacitance across terminals can be obtained without increasing the size of the piezoelectric resonator or changing piezoelectric characteristics.

In the piezoelectric resonator, since a side surface electrode is preferably located at a nodal point on the external surface of the monolithic body, the extensional vibration of the piezoelectric plates is not affected by the location of the side surface electrode for connecting electrode films together.

In accordance with a second preferred embodiment of the present invention, in a piezoelectric component, a plurality of piezoelectric elements are arranged in one plane in a case, thereby achieving a low-profile piezoelectric component. Therefore, when being mounted on a circuit board, the mounting height is not increased thereby contributing to low-profile apparatuses. The structure of a metallic terminal can also be simplified by arranging the piezoelectric elements in one plane, so that the number of the required metallic terminals is also greatly reduced.

In the piezoelectric component, since any of the plural piezoelectric elements may have substantially the same thickness, wasted spaces are prevented from occurring in a case in which the piezoelectric elements are arranged, thereby effectively contributing to a low-profile piezoelectric component. Since the thickness of each piezoelectric element may be substantially the same, assembly of the piezoelectric elements is also improved during assembling with the terminals.

In accordance with a third preferred embodiment of the present invention, in a ladder filter, since series-connected resonators and parallel-connected resonators are arranged in one plane in a case, a low-profile ladder filter can be achieved. Therefore, when being mounted on a circuit board, the mounting height is not increased thereby contributing also to low-profile apparatuses. The structure of a metallic terminal can also be simplified by arranging the ladder filters in one plane, so that the number of the requisite metallic terminals can also be reduced.

Furthermore, since the parallel-connected resonators have a structure of electrodes arranged to extend in the thickness direction, the capacitance across terminals of the parallel-connected resonators can be increased without changing piezoelectric materials or reducing the thickness of the parallel-connected resonators, resulting in an increase of the guaranteed attenuation of the ladder filter.

In accordance with a fourth preferred embodiment of the present invention, in a ladder filter, since parallel-connected resonators have a structure in which electrodes are deposited in the thickness direction by interposing piezoelectric plates between the electrodes, the distance between electrodes is greatly reduced without reducing the thickness of the parallel-connected resonators, resulting in an increased capacitance across terminals of the parallel-connected resonators.

Accordingly, in a fourth preferred embodiment of the present invention, the guaranteed attenuation of the ladder filter is also greatly increased. In particular, while forming the series-connected resonators and the parallel-connected resonators with the same material, the capacitance across terminals of the parallel-connected resonators can be increased larger than that of the series-connected resonators and the guaranteed attenuation of the ladder filter can be increased.

In the ladder filter, the electrodes may be connected together by an external electrode disposed at a nodal point of vibration of the parallel-connected resonators, so that the capacitance across terminals of the parallel-connected resonators can be more increased by parallel-connecting each electrostatic capacitance across electrodes via the external electrodes. Moreover, since the external electrode may be disposed at a nodal point of vibration, piezoelectric vibration of the parallel-connected resonators is not affected or damped.

Preferably, in the ladder filter, the thickness of the series-connected resonators and the parallel-connected resonators are substantially the same, the capacitance across terminals of the parallel-connected resonators is increased larger than that of the series-connected resonators, so that the guaranteed attenuation of the ladder filter is greatly increased. When the thickness of the series-connected resonators and the parallel-connected resonators is substantially the same, it is not necessary as in the conventional ladder filter that the thickness of the parallel-connected resonators is reduced to increase the guaranteed attenuation, which may result in cracking, or the thickness of the series-connected resonators is increased, which results in a heavy or large ladder filter. Having substantially the same thickness of the series-connected resonators and the parallel-connected resonators also simplifies assembly of the ladder filter.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator utilizing extensional vibration, comprising:
   a plurality of piezoelectric plates;
   a plurality of electrode films;
   said piezoelectric plates and said electrode films are alternately disposed so as to be integrated and to define a monolithic piezoelectric body; and
   first and second side surface electrodes substantially disposed only at areas surrounding nodal points located on external side surfaces of said monolithic body, such that said first and second side surface electrodes do not extend over the entire respective external side surface; wherein
   a first set of said plurality of electrode films are electrically connected to each other by said first side surface electrode and a second set of said plurality of electrode films are electrically connected to each other by said second side surface electrode.

2. The resonator according to claim 1, wherein the number of piezoelectric plates and the number of the plurality of electrode films are not equal to each other.

3. The resonator according to claim 1, wherein said plurality of electrode films include first and second external electrodes disposed on first and second major surfaces of said monolithic piezoelectric body, respectively.

4. The resonator according to claim 1, further comprising a side surface electrode, wherein said first set of electrode films include first and second external electrodes electrically connected by the side surface electrode disposed on the side surface of said monolithic body.

5. The resonator according to claim 1, further comprising a side surface electrode, wherein said first set of electrode films are electrically connected to each other by the side surface electrode disposed substantially at a nodal point located at an external side surface of said monolithic body.

6. A piezoelectric device, comprising:
   a plurality of resonators, at least one of said plurality of resonators including at a plurality of piezoelectric plates; and
   a case;
   said plurality of resonators are arranged in one plane of said case; and
   a plurality of internal electrodes disposed parallel to said one plane of said case and between said plurality of piezoelectric plates and arranged to define a unitary body with the plurality of piezoelectric plates.

7. The device according to claim 6, wherein the number of the plurality of piezoelectric plates and the number of the plurality of internal electrodes are not equal to each other.

8. The device according to claim 6, wherein said plurality of piezoelectric plates have substantially the same thickness.

9. A ladder filter, comprising:
   series-connected plate-shaped resonators;
   parallel-connected plate-shaped resonators having internal electrodes disposed in the thickness direction thereof;
   a case;
   said series-connected plate-shaped resonators and said parallel-connected plate-shaped resonators are arranged in one plane of said case; and
   an external electrode substantially disposed only at areas surrounding nodal points of vibration of said parallel-connected resonators, such that the external electrode does not extend over the entire length of the parallel-connected resonators; wherein
   said internal electrodes are connected together by said external electrode.

10. The ladder filter of claim 9, wherein a thickness of said series-connected resonators is substantially the same as a thickness of said parallel-connected resonators.

11. The ladder filter according to claim 9, wherein each of said series-connected resonators and each of said parallel-connected resonators includes a plurality of piezoelectric plates and a plurality of electrode films arranged to define a unitary body.

12. The ladder filter according to claim 11, wherein the number of piezoelectric plates and the number of electrode films are not equal to each other in each of said series-connected resonators and each of said parallel-connected resonators.

13. A ladder filter, comprising:
   series-connected resonators;
   parallel-connected resonators including a plurality of piezoelectric plates and plurality of electrodes, said electrodes disposed in the thickness direction of said parallel-connected resonators and said piezoelectric plates interposed between said electrodes; and a case;

wherein said series-connected resonators are stacked on each other on one side of said case and said parallel-connected resonators are stacked on each other at another side of said case.

14. The ladder filter of claim 13, wherein the height of said series-connected resonators stacked on each other is substantially the same as the height of said parallel-connected resonators stacked on each other.

15. The ladder filter according to claim 13, further comprising an external electrode disposed substantially at a nodal point of vibration of said parallel-connected resonators, wherein said electrodes are connected together by said external electrode.

16. The ladder filter according to claim 15, wherein said external electrode is disposed at the side surface of said parallel-connected resonators.

17. The ladder filter according to claim 13, wherein a thickness of said series-connected resonators is substantially the same as a thickness of said parallel-connected resonators.

* * * * *